United States Patent [19]
Imafuku et al.

[11] Patent Number: 6,074,518
[45] Date of Patent: Jun. 13, 2000

[54] PLASMA PROCESSING APPARATUS

[75] Inventors: Kosuke Imafuku; Shosuke Endo, both of Kofu; Kazuhiro Tahara, Nirasaki; Hiroshi Tsuchiya, Yamanashi-ken; Masayuki Tomoyasu, Nirasaki; Yukio Naito, Kofu; Kazuya Nagaseki; Ryo Nonaka, both of Yamanashi-ken; Keizo Hirose, Kofu; Yoshio Fukasawa, Kofu; Akira Koshiishi, Kofu; Isao Kobayashi, Yamanashi-ken, all of Japan

[73] Assignees: Tokyo Electron Limited, Tokyo; Tokyo Electron Yamanashi Limited, Nirasaki, both of Japan

[21] Appl. No.: 09/225,010

[22] Filed: Jan. 4, 1999

Related U.S. Application Data

[63] Continuation of application No. 08/365,119, Dec. 28, 1994.

[30]    Foreign Application Priority Data

| Apr. 20, 1994 | [JP] | Japan | 6-106044 |
| Sep. 1, 1994 | [JP] | Japan | 6-234093 |
| Sep. 20, 1994 | [JP] | Japan | 6-252962 |
| Sep. 20, 1994 | [JP] | Japan | 6-252963 |

[51] Int. Cl.$^7$ ............................ C23F 1/02; C23C 16/00
[52] U.S. Cl. ............ 156/345; 118/723 E; 118/723 MA
[58] Field of Search .................. 118/723 E, 723 ER, 118/723 MA, 723 MR, 723 I, 723 IR; 156/345; 315/111.41

[56]    References Cited

U.S. PATENT DOCUMENTS

| 5,215,619 | 6/1993 | Cheng et al. | 156/345 |
| 5,556,501 | 9/1996 | Collins et al. | 156/345 |
| 5,795,452 | 8/1998 | Kinoshita et al. | 204/298.37 |

*Primary Examiner*—Thi Dang
*Assistant Examiner*—Luz Alejandro
*Attorney, Agent, or Firm*—Oblon, Spivak, McClelland, Maier & Neustadt, P.C.

[57]    ABSTRACT

A plasma processing apparatus comprises a chamber, and an upper electrode and a lower electrode, parallelly provided in the chamber to oppose each other at a predetermined interval, for defining a plasma generation region between the electrodes. An object to be processed is mounted on the lower electrode. RF powers are supplied to the electrodes, so that a plasma generates between the electrodes, thereby performing a plasma process with respect to the object to be processed. A cylindrical ground electrode is provided around the plasma generation region in the chamber, for enclosing the plasma in the plasma generation region, and has a plurality of through holes for passing a process gas.

3 Claims, 16 Drawing Sheets

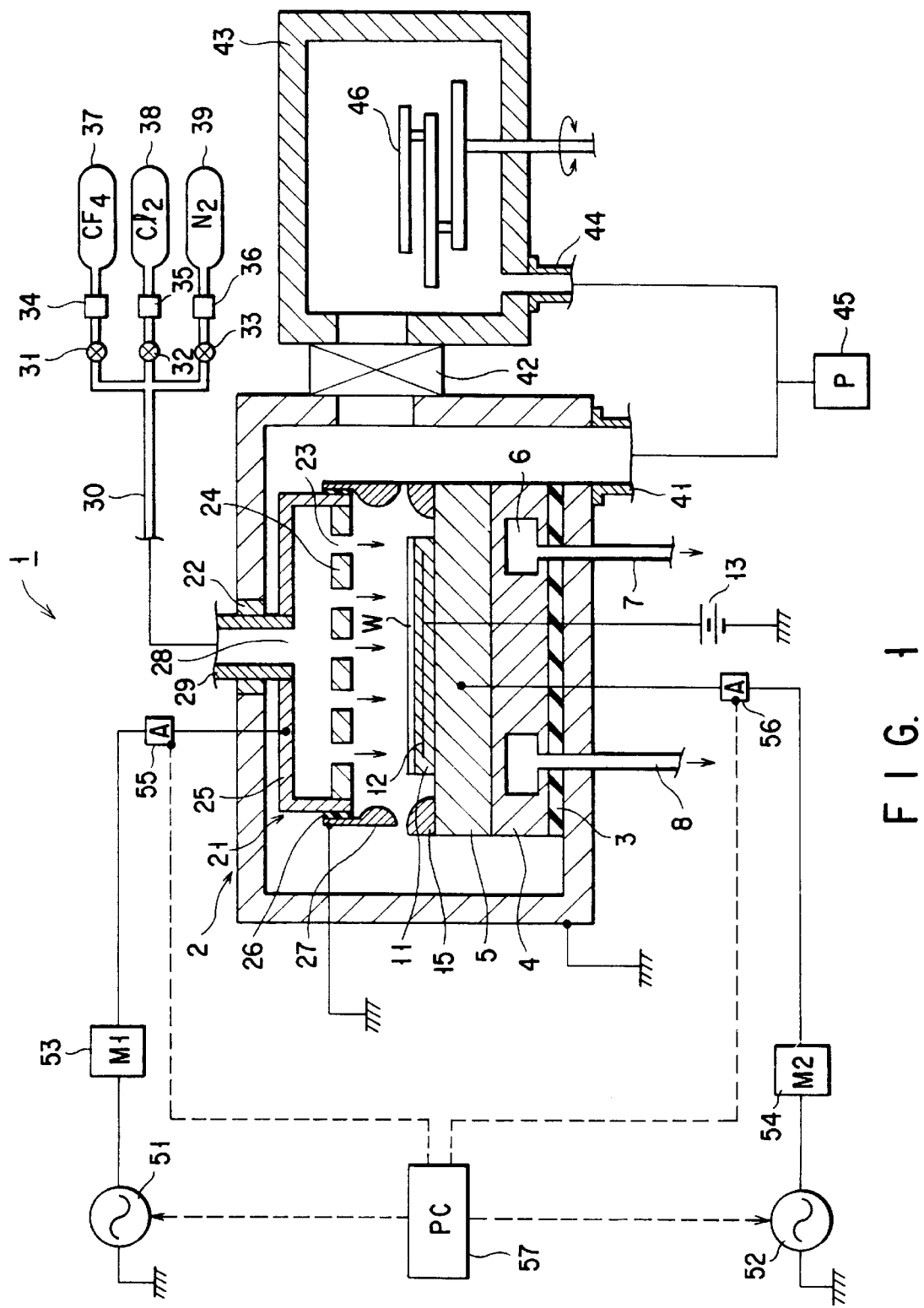
F I G. 1

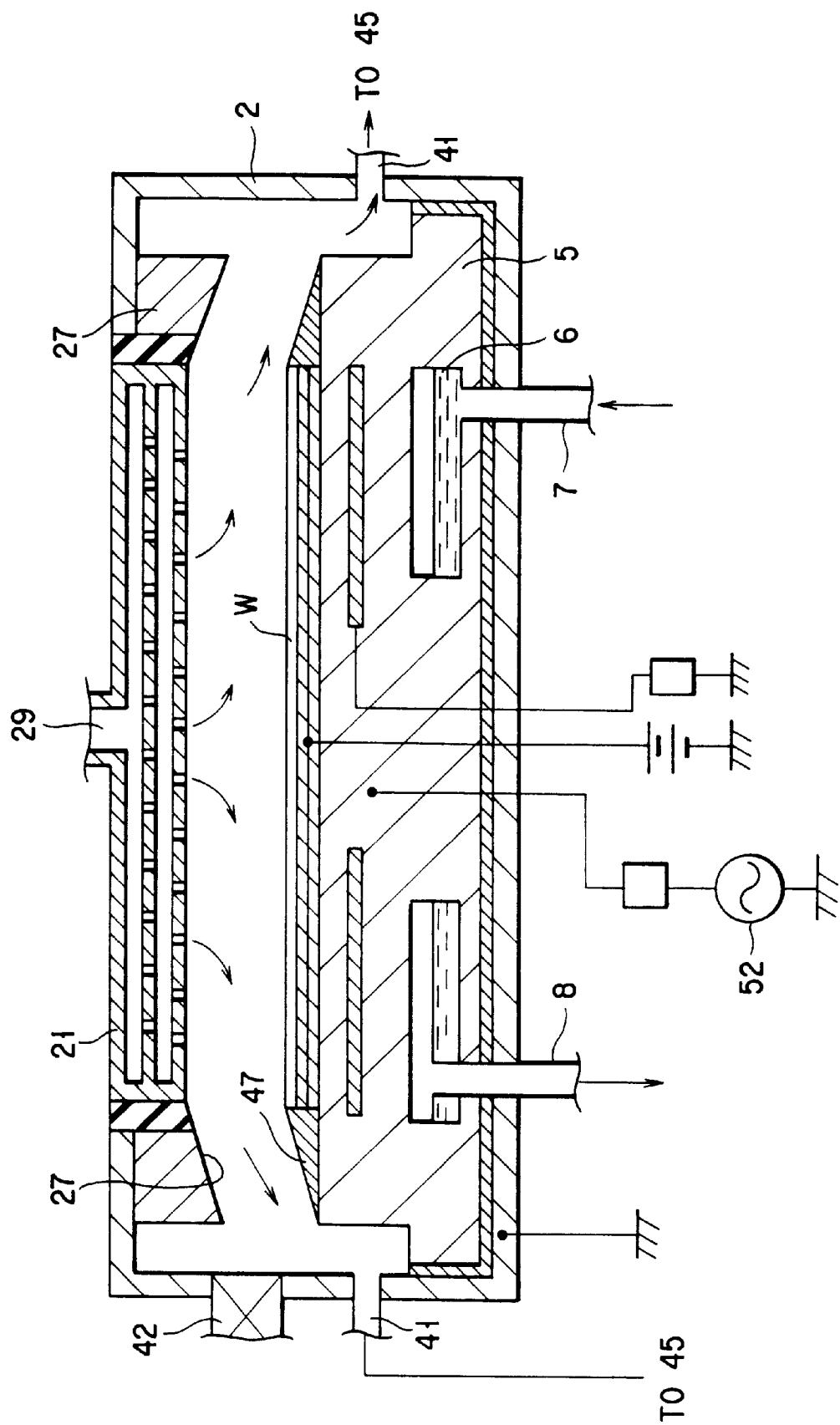
F I G. 11

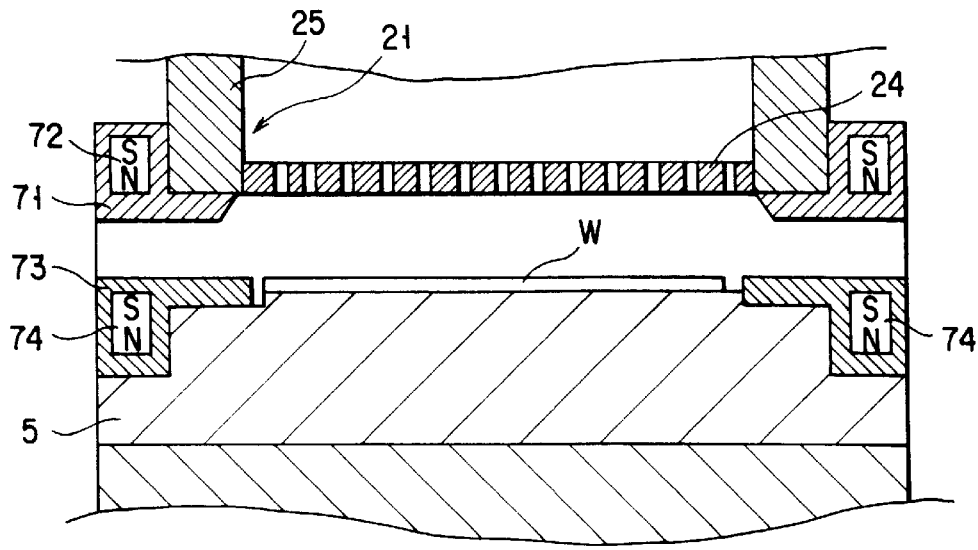
FIG. 12
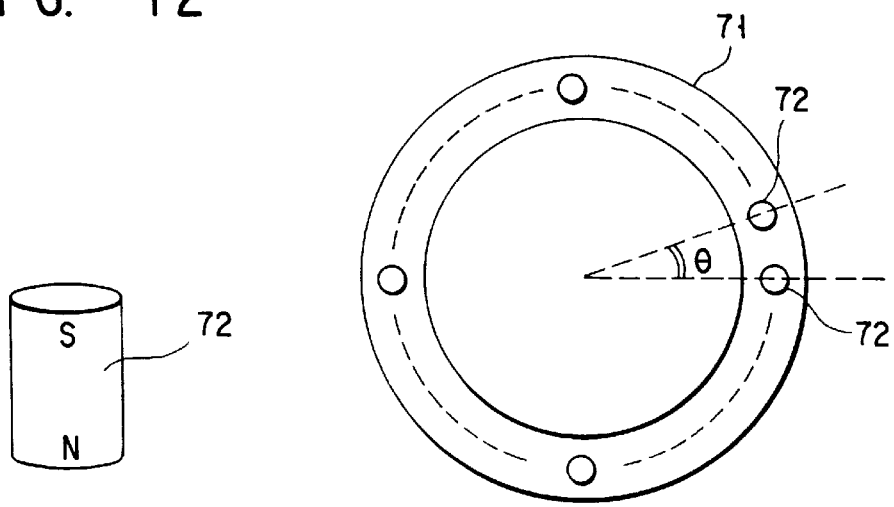
FIG. 13
FIG. 14
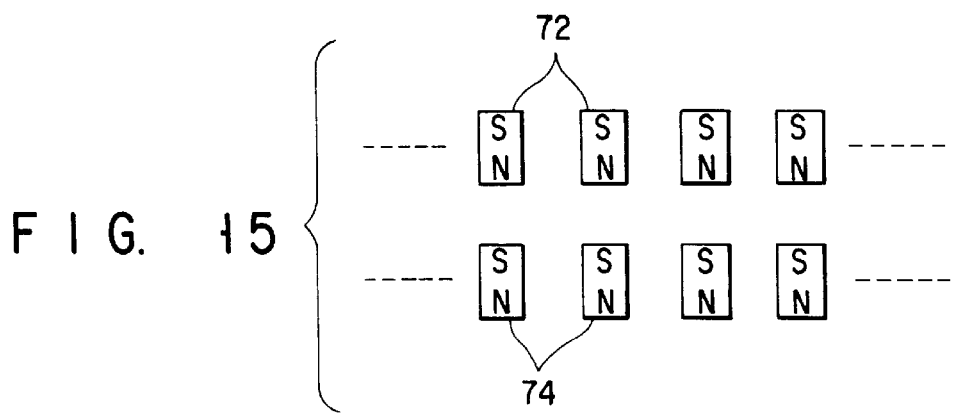
FIG. 15

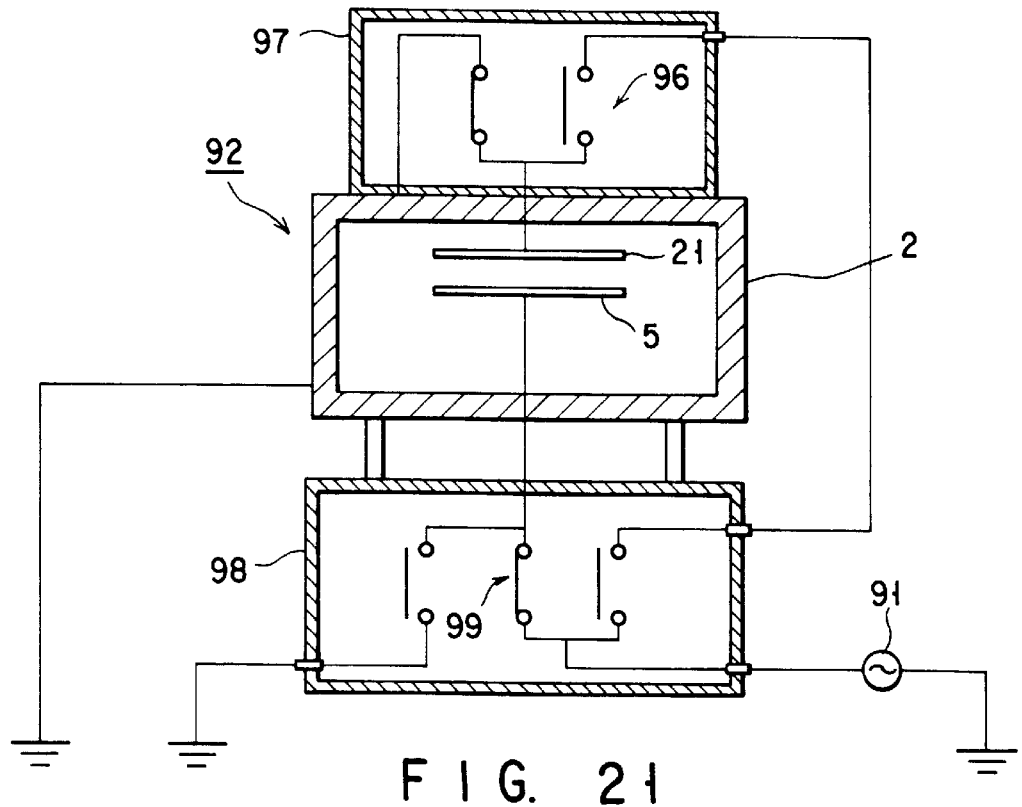
F I G. 21
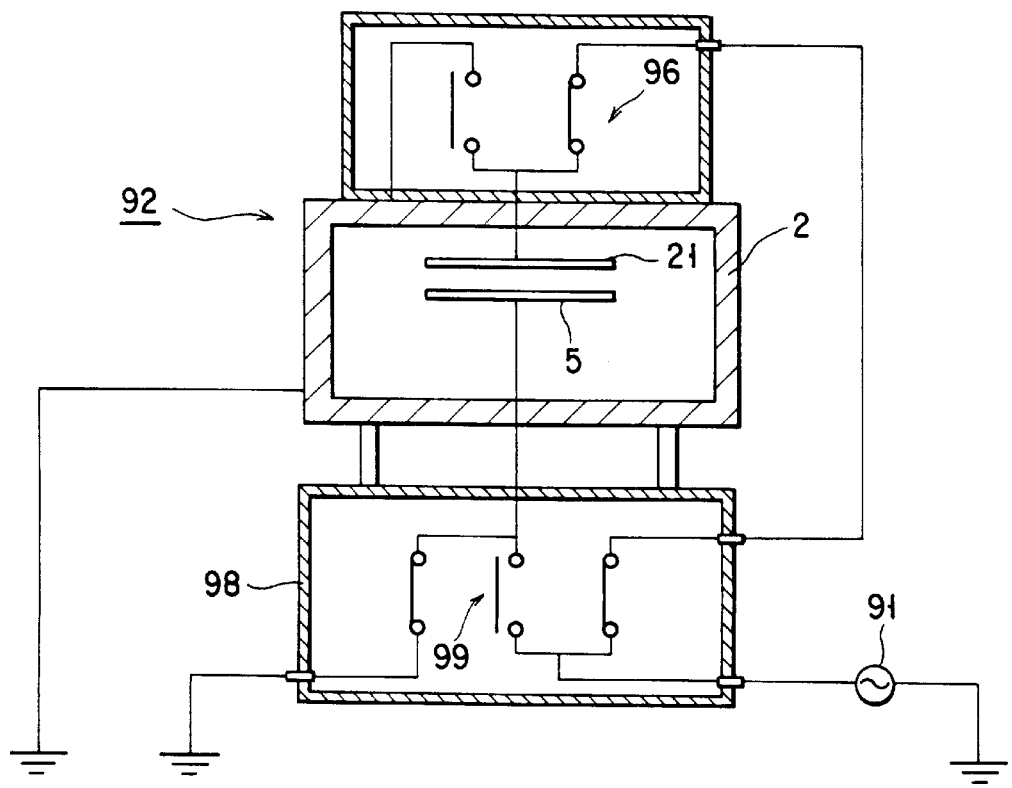
F I G. 22

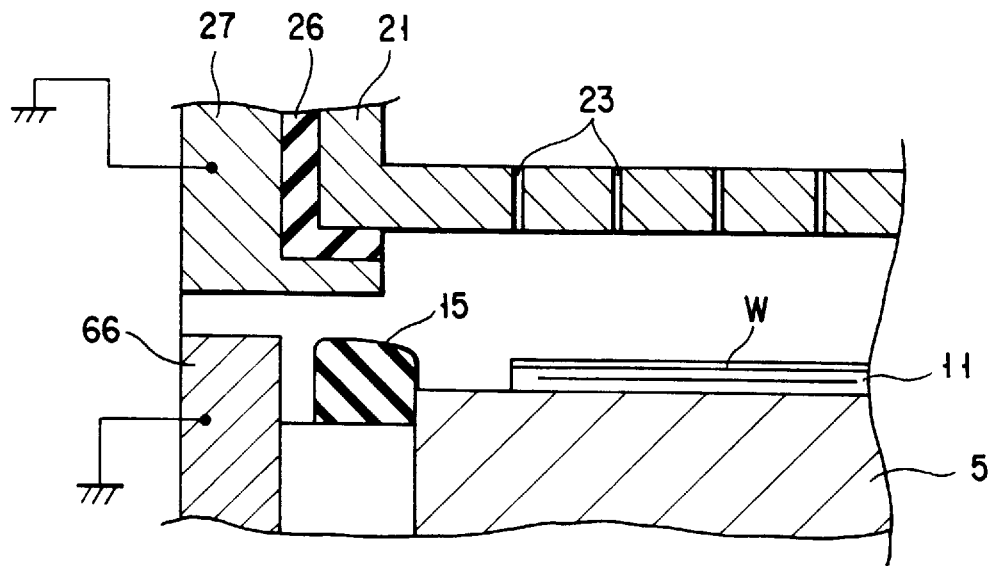
F I G. 24
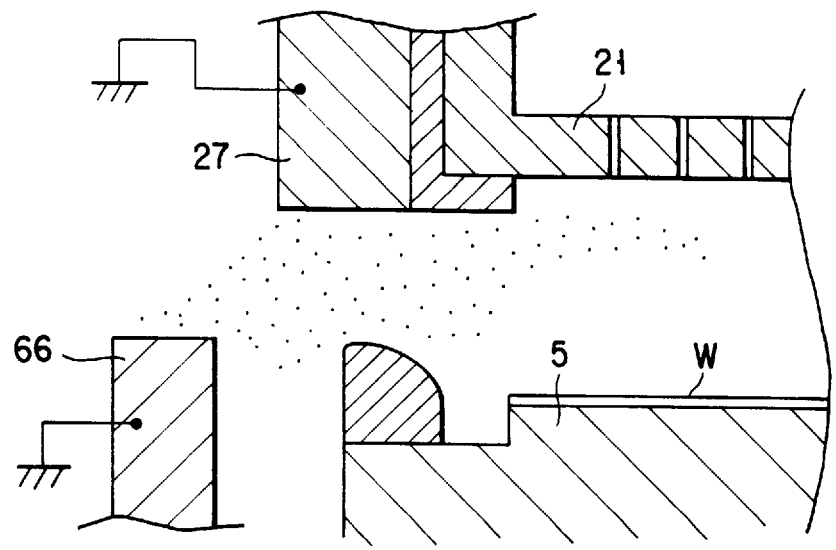
F I G. 25

PLASMA PROCESSING APPARATUS

This application is a continuation of application Ser. No. 08/365,119 filed on Dec. 28, 1994.

BACKGROUND OF THE INVENTION

1. Field of the Invention

The present invention relates to a plasma processing apparatus having a pair of opposing electrodes.

2. Description of the Related Art

Various conventional plasma processing apparatuses have been used to surface-treat a semiconductor wafer (to be referred to as a wafer hereinafter) in a variety of applications such as a semiconductor manufacturing process. Of these apparatuses, a so-called parallel plate type plasma processing apparatus is excellent in uniformity and has advantages capable of processing a large-diameter wafer. In addition, the apparatus arrangement is relatively simple, and therefore the apparatus of this type is very popular.

In the conventional general parallel plate type plasma processing apparatus, upper and lower electrodes oppose each other at a predetermined distance so as to be parallel to each other in a processing chamber. A wafer serving as an object to be processed is placed on, e.g., the lower electrode. For example, in an etching process, an etching gas is supplied to the chamber, and at the same time, an RF power is applied to at least one of the opposing electrodes to generate a plasma therebetween. The wafer is etched using etchant ions produced by dissociation of the etching gas. Advanced micropatterning and an increase in process speed are demanded along with an increase in integration density of semiconductor devices. To meet these demands, the density of the plasma generated between the electrodes must also be increased.

Regarding this point, a magnetron plasma processing apparatus using a magnetron as a new plasma generating method is disclosed in, e.g., Jpn. Pat. Appln. KOKAI Publication No. 57-159026 entitled "Dry Etching Method". An arrangement using a common anode electrode such as a grid-like electrode between upper and lower electrodes, in addition to normal electrodes is disclosed in Jpn. Pat. Appln. KOKOKU Publication No. 58-12346 entitled "Plasma Etching Apparatus".

Although the magnetron plasma processing apparatus can generate a high-density plasma in a relatively high vacuum, a change in magnetic field is slower than a change in frequency of an RF electric field. A plasma state changes with variations in magnetic field. This change causes variations in energy and directivity of ions. Elements formed on a wafer may be damaged, or the shape of a pattern on the wafer may be degraded.

Although the common anode arrangement has an advantage in that an ion energy and a current density can be independently controlled, the plasma is diffused through the grid, and the density of an ion current incident on the wafer is lowered. As a result, the process rate may be lowered or the process may become nonuniform.

When an RF high-vacuum atmosphere is required along with an increase in patterning density, an impedance between an electrode and the inner wall of the chamber is lowered, and the plasma tends to be diffused.

When the plasma is diffused outward in the chamber, as described above, not only the decrease in plasma density occurs, but also metal contamination on the inner wall of the chamber occurs. For this reason, the wafer serving as an object to be processed is contaminated. This tendency will become more conspicuous in a future plasma process in a high degree of vacuum required for the advanced micropatterning.

SUMMARY OF THE INVENTION

It is an object of the present invention to provide a plasma processing apparatus wherein, to properly practice a plasma process for the advanced micropatterning, a relatively simple parallel plate apparatus arrangement can be employed, outward diffusion of a plasma in a chamber can be prevented, a plasma is enclosed in a plasma generation region to obtain a high plasma density, and at the same time, wafer contamination will rarely occur.

In a plasma processing apparatus of the present invention, a means for enclosing a plasma in the plasma generation region or process region is arranged around the plasma generation region in the chamber. The plasma is left in the plasma generation region and will not be diffused outside the plasma generation region. For this reason, the plasma density in the process region is increased, and no contamination on the inner wall of the chamber will occur.

When the plasma enclosing means comprises an insulator which surrounds the plasma generation region, diffusion of ions in the plasma is directly regulated by this insulator.

When the plasma enclosing means comprises a third electrode electrically grounded, ions which tend to diffuse outside the plasma generation region positively move to this third electrode side, thereby preventing plasma diffusion.

Only in consideration of the purpose as prevention of plasma diffusion, the plasma enclosing means preferably comprises a member (e.g., a cylinder) which can surround the plasma generation region. However, also in consideration of discharge of the etching gas supplied in the plasma generation region, a plurality of through holes are formed in this cylinder. Plasma diffusion can be prevented without impairing gas discharge.

The grounded third electrode positively traps the ions. If the third electrode has an almost annular form to surround the plasma generation area, and the inner surface of the third electrode is curved in a convex shape toward the plasma generation area, the surface area exposed to the plasma is increased. The prescribed object can be achieved even for a plasma generated with a high power. When third and fourth almost annular ground electrodes are arranged near the first and second electrodes, respectively, the ground electrodes trap the ions from the first and second electrodes, thereby preventing plasma diffusion. That is, the third electrode traps the ions from the second electrode, and the fourth electrode traps the ions from the first electrodes, thereby preventing plasma diffusion. In this case, when the outer circumferential edges of the two grounded electrodes, i.e., the third and fourth electrodes are arranged to overlap each other, plasma diffusion can be further prevented.

According to another aspect of the present invention, a plurality of magnets are arranged in an annular form near each of the first and second electrodes in the chamber. At the same time, the magnets of the first group arranged on the first electrode side are set oppose the magnets of the second group arranged on the second electrode side such that the magnetic poles of opposing magnet pairs around the first and second electrodes are opposite to each other. Local magnetic fields are formed around the space between the first and second electrodes, the charged particles in the plasma can be trapped, and plasma diffusion can be prevented.

The magnets have opposing magnetic poles not only between the magnets arranged on the first electrode side and the magnets arranged on the second electrode side, but also between the adjacent magnets near the first or second electrodes. Therefore, the density of trapping the charged particles by the magnetic fields can be increased, and a higher plasma diffusion preventive effect can be obtained.

The magnetic field strength generated by the magnets is preferably set to 10 Gauss or less because the prescribed plasma process is performed without adversely affecting the plasma in the plasma process region of the object to be processed such as a wafer.

RF powers may be supplied to the first and second electrodes, respectively. In this case, the voltages of the respective RF powers can be easily set variable independently of each other.

The current phase difference of the RF powers respectively supplied to the first and second electrodes is controlled to be preferably about 180° to efficiently supply the RF powers to generate the plasma regardless of the degree of vacuum in the chamber and the type of process gas supplied to the chamber. Therefore, the plasma density near the object to be processed increases, and the current density of ions incident on the object to be processed can increase.

In this case, assume that the means for controlling the current phase difference to about 180× comprises a detecting means for detecting phases of RF currents flowing through the electrodes and outputting phase signals and a means for detecting a phase difference from these phase signals and outputting the phase difference. The above control can be smoothly performed. If the detecting means for detecting the phases of the RF currents and outputting the phase signals comprises a current transformer, the apparatus arrangement can be preferably simplified. In this case, the current transformer is preferably arranged at a position closest to the electrodes to suppress an influence of a phase shift in a transmission line or a matching unit, thereby performing accurate detection.

The process vessel or chamber is grounded, the first and second electrodes are insulated from this chamber, an RF power can be selectively supplied from one RF power supply to the first or second electrode, and the first and second electrodes can be freely grounded. With this arrangement, two plasma process modes, i.e., a mode for grounding the second electrode while the RF power is supplied to the first electrode, and a mode for grounding the first electrode while the RF power is supplied to the second electrode, can be obtained.

Two different plasma process modes can be obtained in one chamber. For example, when an object to be processed is to be placed on the first electrode and etched, an etching process with a high DC bias can be performed in the former mode, while an etching process with a low DC bias can be performed in the latter mode. Therefore, different processes can be continuously performed in the single chamber, or the application range of the process can be widened.

In this case, when the electrode supplied with the RF power is switched, the other electrode is grounded. The two modes can be switched using, e.g., one relay system.

When an RF power output is periodically modulated in each plasma processing apparatus described above, the plasma density can be repeatedly changed to allow dissociation control of gas components in a plasma. For example, in an etching process for forming a contact hole, etching is progressed with a high output, while a process for discharging an etching reaction product from the hole with a low output can be performed. Therefore, the etch rate can be set high, and etching excellent in vertical anisotropy capable of suppressing a difference in size between the bottom and inlet portions of the hole can be performed.

In this case, when a minimum output is set to fall within the range of ½ to ⅕ the maximum output as in claim 15, a preferable state for discharging the etching reaction product while maintaining a plasma state can be obtained.

When a gap length between the upper and lower electrodes is set to 10 to 40 mm, preferably 15 to 30 mm, and more preferably about 25 mm, and relative RF powers are respectively supplied to the upper and lower electrodes to generate a plasma, a process balanced in etch rate, uniformity, and plasma stability, as will be described later in the subsequent embodiments, can be performed.

When an RF power is supplied to the upper electrode and then to the lower electrode with a delay to generate a plasma, an overvoltage is not applied to an object placed on the lower electrode, and the object is rarely damaged.

To stop generation of a plasma, the power supplied to the lower electrode is stopped first, and then the power supplied to the upper electrode is stopped with a delay. In this case, deposition is not progressed, and damage to the object to be processed can be prevented. That is, a state, in which the voltage is applied to only the lower electrode on which the object to be processed is placed, can be prevented, and the object to be processed can be protected from an overvoltage. The delay timing is effectively set to be one second or less so as to obtain the prescribed effect.

A matching means is preferably arranged to independently control the impedance and the phase. For this reason, control can withstand the disturbance, and matching against load variations can be facilitated.

Advanced micropatterning in a high vacuum can be performed because the internal pressure of the chamber can be preferably set to fall within the range of 5 mTorr to 100 mTorr.

When a gas is to be discharged from the plasma generation region through a gas discharge means, a tapered surface directing toward the gas discharge means is preferably formed on the lower surface of a gas guide means or plasma enclosing means. This tapered surface can be formed on the lower surface portion of the diffusion cylinder extending downward, around the upper electrode. The tapered surface has a predetermined angle toward the lower outer direction, preferably 25° to 35° with respect to the horizontal plane.

Preferably, at least part of the surface of the upper electrode consists of $SiO_2$, and at least part of the surface of the focus ring consists of BN or a material containing BN, thereby effectively preventing underlying silicon from being etched by fluorine radicals produced by the process gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view for explaining an etching apparatus according to an embodiment of the present invention;

FIG. 11 is a schematic view showing an etching apparatus according to still another embodiment;

FIG. 12 is an enlarged sectional view showing the main part near an upper electrode and a susceptor when permanent magnets are used as a plasma diffusion preventive means;

FIG. 13 is a perspective view showing the permanent magnet in FIG. 12;

FIG. 14 is a bottom view of an insulating member wherein an arrangement of the permanent magnets in FIG. 12 is represented;

FIG. 15 is a view for explaining an arrangement of the permanent magnets in FIG. 12;

FIG. 21 is a view for explaining still another embodiment of the present invention in the RIE mode;

FIG. 22 is a view for explaining still another embodiment of the present invention in the PE mode;

FIG. 24 is a view for explaining the main part of the etching apparatus in FIG. 23;

FIG. 25 is a view for explaining a state wherein the outer circumferential edge of a ground electrode at the upper electrode side and that of a ground electrode at the lower electrode side do not overlap;

DETAILED DESCRIPTION OF THE PREFERRED EMBODIMENTS

Figure 2:
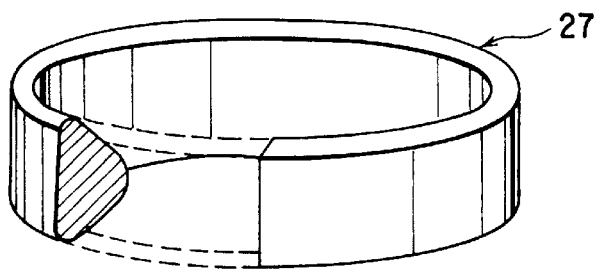
FIG. 2 is a partially cutaway perspective view showing a ground electrode used in the etching apparatus in FIG. 1.

Embodiments of the present invention will be described below with reference to the drawings.

FIG. 1 schematically shows a section of an etching apparatus 1 used to practice this embodiment. The etching apparatus 1 is constituted as a so-called parallel plate type etching apparatus wherein electrodes parallelly oppose.

The etching apparatus 1 has a process chamber 2 formed to be a cylindrical shape consisting of such as aluminum whose surface is anodized. The chamber 2 is electrically grounded.

An almost columnar susceptor support table 4 for placing an object to be processed, e.g., a semiconductor wafer (to be referred to as a wafer hereinafter) W, is located on the bottom formed in the chamber 2 through an insulating plate 3 consisting of a ceramic or the like. A susceptor 5 constituting a lower electrode is provided on the susceptor support table 4.

An annular coolant chamber 6 is provided in the susceptor support table 4. A temperature-adjusting coolant such as perfluoropolyether can be introduced into the coolant chamber 6 through a coolant inlet pipe 7. The introduced coolant circulates in the coolant chamber 6. Heat for cooling, generated during this circulation, is transferred from the coolant chamber 6 to the wafer W through the susceptor 5 to cool the target surface of the wafer W to a predetermined temperature.

The upper surface of the susceptor 5 is formed to be flat, and an electrostatic chuck 11 having almost the same dimension as that of the wafer W is provided thereon. The electrostatic chuck 11 is arranged such that a conductive layer 12 is interposed between two polyamide films. When a DC high voltage of, e.g., 1.5 kV is applied from a DC high-voltage power supply 13 located outside the chamber 2 to the conductive layer 12, the wafer W placed on the upper surface of the electrostatic chuck 11 is chucked and held by a Coulomb force at this position.

An annular focus ring 15 is arranged at the peripheral edge portion of the upper end of the susceptor 5 so as to surround the wafer W placed on the electrostatic chuck 11. The focus ring 15 consists of an insulating material which does not attract reactive ions, and lets reactive ions produced by a plasma be effectively incident only on the wafer W at the inner side of the susceptor 5.

An upper electrode 21 is supported at the upper portion of the chamber 2 through an insulating member 22 above the susceptor 5 to parallelly oppose the susceptor 5. The lower surface of the upper electrode 21 is positioned at a position spaced apart from the susceptor 5 by about 10 to 40 mm, and preferably 15 to 30 mm, for example 25 mm. The upper electrode 21 is constituted by an electrode plate 24 which opposes the susceptor 5, has a large number of diffusion holes 23, and consists of SiC, amorphous carbon, or the like, a cylindrical electrode support member 25 supporting the electrode plate 24 and consisting of a conductive material such as aluminum whose surface is anodized, and a gas inlet port 28 around which the insulating member 22 is located. A region wherein a plasma is generated is defined between the upper electrode 21 and the susceptor 5.

A ground electrode 27 as the third electrode is provided around the electrode support member 25 through an annular insulating member 26, as shown in FIG. 2. As shown in FIG. 1, the ground electrode 27 is set such that its lower end portion forms, with the upper end portion of the focus ring 15, a gap through which a process gas and the wafer W can pass. In addition, as shown in FIGS. 1 and 2, the inner circumference of the ground electrode 27 projects inward. The ground electrode 27 is located to surround a space region between the susceptor 5 and the electrode plate 24 from its side portion.

A gas inlet pipe 29 is connected to the gas inlet port 28 provided at the center of the electrode support member 25 of the upper electrode 21. A gas supply pipe 30 is connected to the gas inlet pipe 29, and branched into three portions to communicate with corresponding process gas sources 37, 38, and 39 through respective valves 31, 32, and 33, and also mass flow controllers 34, 35, and 36.

In this embodiment, the first process gas source 37, the second process gas source 38, and the third process gas source 39 are set to supply a $CF_4$ gas, a $Cl_2$ gas, and an $N_2$ gas as an inert purge gas, respectively.

A discharge pipe 41 is connected to the lower portion near the peripheral portion of the chamber 2. The discharge pipe 41 and a discharge pipe 44 of a load-lock chamber 43 adjacent to the chamber 2 through a gate valve 42 communicate with an evacuating means 45 such as a turbo molecular pump to evacuate the interior of the chamber to a predetermined reduced-pressure atmosphere.

The wafer W as the object to be processed is conveyed between the chamber 2 and the load-lock chamber 43 by a convey means 46 such as a convey arm provided in the load-lock chamber 43.

An RF power for generating a plasma between electrode positions in the chamber 2 of the etching apparatus 1 is supplied by two RF power supplies 51 and 52 for oscillating an RF frequency of, e.g., 13.56 MHz. The RF power supply 51 is connected to the upper electrode 21 through a matching unit 53 to apply an RF power to the electrode 21. The other RF power supply 52 is connected to the susceptor 5 through a matching unit 54 to apply an RF power to the susceptor 5. In this manner, RF powers are supplied to the upper electrode 21 and the susceptor 5 from the RF power supplies independent of each other. Voltages to be applied to the upper electrode 21 and the susceptor 5 are independent of each other and variable.

Phase detecting means 55 and 56 for detecting phase signals of currents of RF powers to be supplied are provided between the matching unit 53 and the upper electrode 21, and between the matching unit 54 and the susceptor 5, respectively. Phase signals detected by the respective phase detecting means 55 and 56 are input to a phase controller 57. The phase controller 57 controls the RF power supplies 51 and 52 to oscillate RF frequencies whose phases are different by 180° on the basis of the detection signals.

This embodiment will exemplify below a case wherein a silicon oxide film ($SiO_2$) on the wafer W having a silicon substrate is to be etched using the etching apparatus 1 according to this embodiment.

After the gate valve 42 is opened, the wafer W as the object to be processed is conveyed from the load-lock chamber 43 to the process chamber 2 by the convey means 46, and placed on the electrostatic chuck 11. The DC high-voltage power supply 13 is turned on, and the wafer W is chucked and held on the electrostatic chuck 11 upon this application to the electrodes. After the convey means 46 retreats into the load-lock chamber 43, the interior of the chamber 2 is evacuated by the evacuating means 45.

When the first valve 31 is opened, the $CF_4$ gas is introduced from the first process gas source 37 to the upper electrode 21 through the gas supply pipe 30, the gas inlet pipe 29, and the gas inlet port 28 while its flow rate is adjusted by the mass flow controller 34. The $CF_4$ gas is then delivered toward the wafer W through the diffusion holes 23 of the electrode plate 24 as represented by arrows in FIG. 1. By selecting the distribution of the diffusion holes 23, the delivered gas can have a uniform distribution.

After the pressure in the chamber 2 is set and kept at, e.g., 5 mTorr to 100 mTorr, the RF power supplies 51 and 52 operate to supply RF powers having current phases different from each other by 180° to the upper electrode 21 and the susceptor 5, respectively, thereby generating a plasma between the upper electrode 21 and the susceptor 5. Predetermined etching is performed with respect to the wafer W using radical components produced by dissociating the $CF_4$ gas introduced in the chamber 2.

The plasma in the above etching process is generated between the upper electrode 21 and the susceptor 5 as described above. However, as described above, since the third electrode or ground electrode 27 is arranged to surround the space region between the upper electrode 21 and the susceptor 5 from its side portion, ions which tend to scatter horizontally outward from the space region are attracted by the ground electrode, and prevented from being scattered to the outside of the space region, e.g., the inner wall of the chamber 2. Therefore, a plasma density in the space region, i.e., a process region with respect to the wafer W can be kept high, thereby realizing advanced micropatterning with respect to the wafer W. At this time, the process gas is discharged from the gap between the ground electrode 27 and the focus ring 15 at a constant flow speed.

Since ions are prevented from being scattered to the inner wall of the chamber 2, the inner wall of the chamber 2 is not etched, or a reaction product is not attached thereto. Instead, the inner circumferential surface of the ground electrode 27 is etched, or a reaction product is attached. However, this can be minimized by selecting the shape of this inner circumferential surface. Since this ground electrode 27 is light and compact, it can be easily and freely mounted on the upper electrode 21 or the chamber 2, and maintenance and/or exchange can be easily performed. Therefore, contamination is rarely caused, and the yield is not decreased from this viewpoint.

The RF powers respectively supplied to the upper electrode 21 and the susceptor 5 to generate a plasma have the current phases different by 180°. For this reason, the RF powers can be supplied to the plasma regardless of the type of process gas and the degree of a low pressure, and the density of an ion current which is incident on the wafer W can be increased.

More specifically, when a phase difference between the frequencies of the RF powers supplied to the electrodes opposing each other is changed, a plasma state is changed (e.g., Jpn. Pat. Appln. KOKAI Publication No. 2-224239). For example, when the voltage phases of two RF powers are almost the same, a plasma spreads, and its density is decreased, resulting in a decrease in process speed. On the other hand, when a voltage phase difference is 180°, the plasma density becomes high. However, the voltage phase difference by which the plasma density is highest at a frequency of 380 kHz is different from that at a frequency of 13.56 MHz. This may be caused by a change in impedance of the plasma.

Similarly, when the composition of a process gas is changed, an impedance of the plasma also changes in accordance with characteristics of a sectional area of gas ionization, or a difference between characteristics of dissociation.

For this reason, in the conventional method of supplying an RF power by controlling a voltage phase, when a voltage relationship wherein a current flowing from one electrode flows into the opposing electrode by a phase difference is not obtained, the highest plasma density state is difficult to realize because the current diffuses to, e.g., the inner wall of the chamber except for the opposing electrodes.

By controlling current phases to be different by 180° as described above, when the current is to flow from one electrode, e.g., the upper electrode 21, to the susceptor 5 as the other opposing electrode, the current efficiently flows into the susceptor 5 regardless of a change in plasma impedance because the phase of the susceptor 5 has the relationship to flow the current. As a result, the plasma is enclosed between the upper electrode 21 and the susceptor 5 to increase its density.

In this embodiment, as described above, since the plasma is also enclosed by the ground electrode 27, all these electrodes cooperate to realize a higher plasma density and finer micropatterning.

Figure 3:
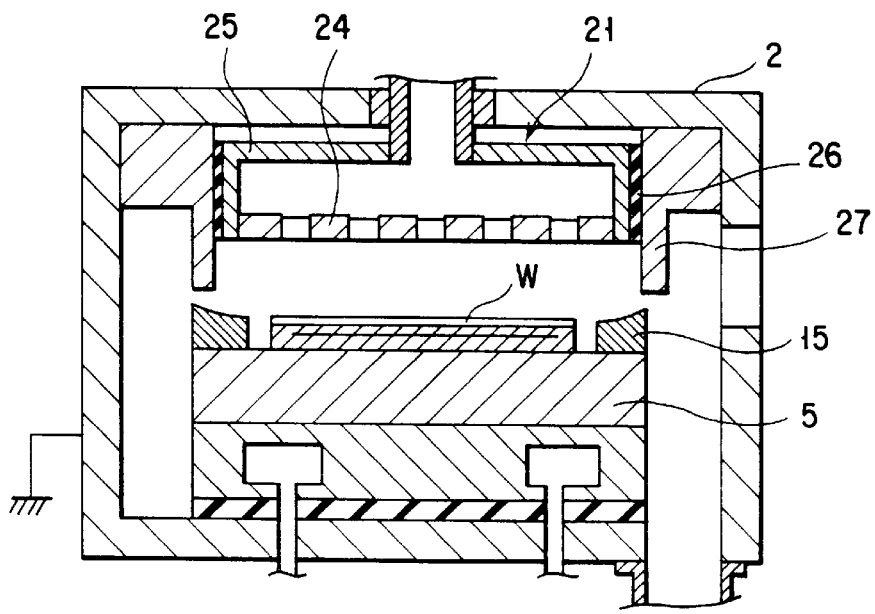
FIG. 3 is a sectional view for explaining a chamber using a ground electrode having another arrangement.
Figure 4:
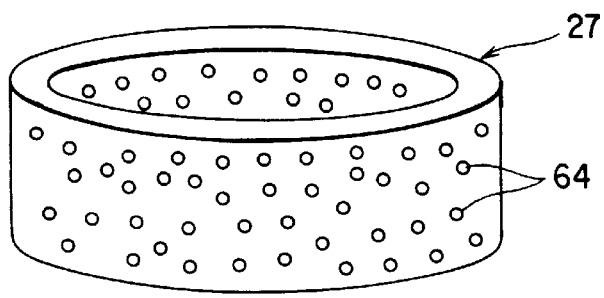
FIG. 4 is a perspective view showing a ground electrode having through holes.

The ground electrode 27 used in this embodiment has a projecting shape at the inner side to form a taper so as not to interrupt the flow of the gas. In place of this, as shown in FIG. 3, a cylindrical ground electrode 61 having a flat inner circumferential surface can be arranged around the electrode support member 25 through an insulating member 62 to electrically connect the grounded chamber 2 and the ground electrode 61. In this case, the ground electrode 61 can be freely mounted in the chamber 2 by a means such as a screw. The insulating member 62 preferably contacts the ground electrode 61 or is separated from it. In order to set an opposing plasma generation region as a further closed space, the height of the ground electrode can be increased, i.e., the ground electrode can have a cylindrical shape largely extending downward. In this case, in order to fully assure discharge of a process gas introduced to the opposing plasma generation region, a plurality of through holes 64 are preferably formed in a ground electrode 63, as shown in FIG. 4. The ground electrode 61 and/or the susceptor 5 can be vertically movable for loading of a wafer.

Figure 5:
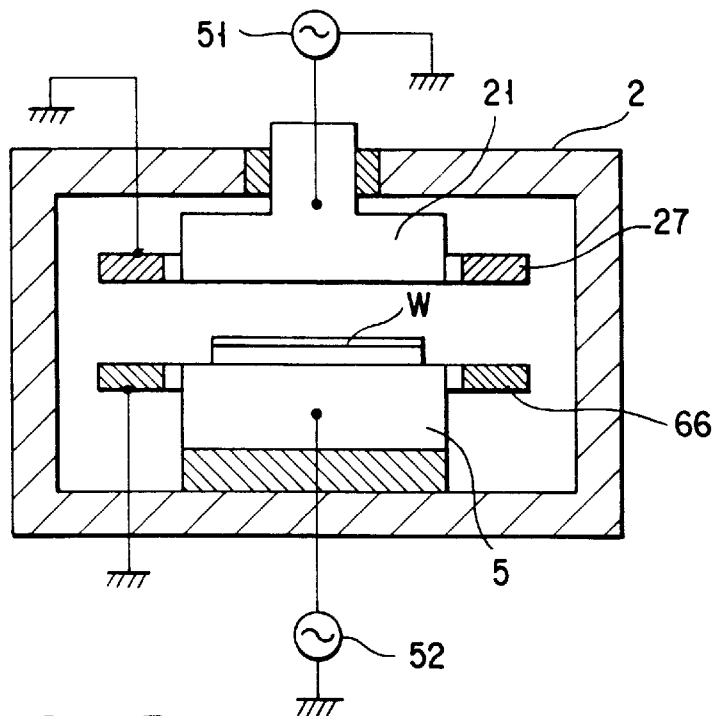
FIG. 5 is a sectional view for explaining a chamber using opposing ground electrodes.

Further, the third electrode means may be constituted by a pair of ground electrodes 27 and 66, as shown in FIG. 5. As is apparent from FIG. 5, the ground electrodes 27 and 66 have an almost ring-like shape. One ground electrode 27 is arranged around the upper electrode 21, and the other ground electrode 66 is arranged around the vicinity of the upper end portion of the susceptor 5 (in this case, the upper portion of the so-called discharge ring can have the above arrangement). With this arrangement, charged particles which tend to scatter from the vicinity of the upper electrode 21 are attracted to the ground electrode 66, and charged particles which tend to scatter from the vicinity of the susceptor 5 are attracted to the ground electrode 27. As a result, the plasma generated between the upper electrode 21 and the susceptor 5 rarely diffuses to the inner wall of the chamber 2.

Figure 6:
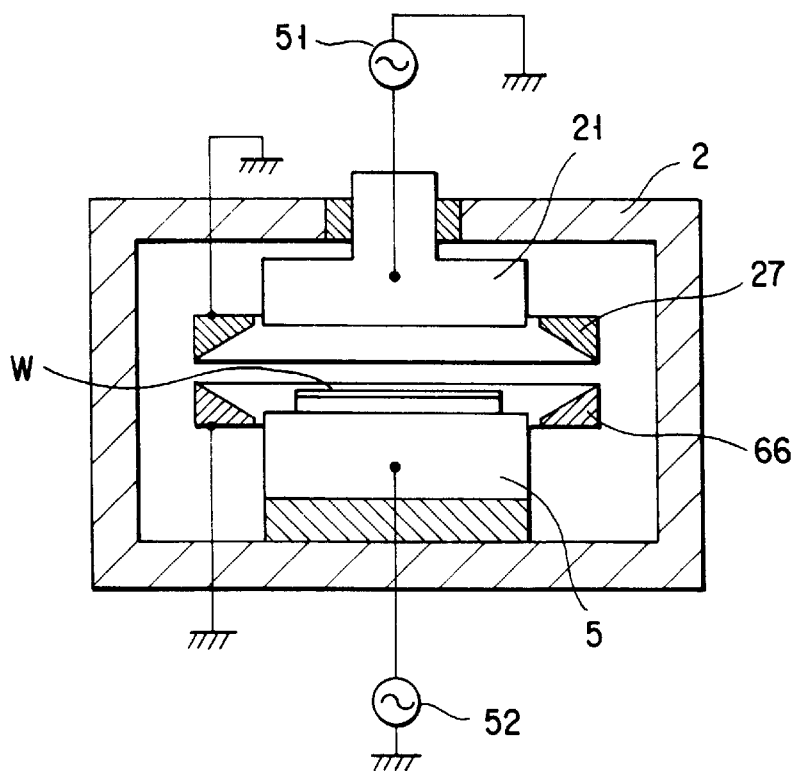
FIG. 6 is a sectional view for explaining a chamber using opposing ground electrodes each having an inclined surface portion at the inner side.

Ground electrodes 27 and 66 shown in FIG. 6 have a ring-like shape and an almost triangular sectional surface such that its inner side surface forms an inclined surface at the lower inner side. According to the ground electrodes 27 and 66 having the above arrangement, since, e.g., the inclined surface portion at the inner side of the upper ground electrode 27 directs toward the susceptor 5, it can attract charged particles more efficiently than the ground electrode 27 shown in FIG. 5. A plasma diffusion preventive effect can be further enhanced.

Both the ground electrodes as shown in FIGS. 5 and 6 have a vertically opposing arrangement. However, the arrangement is not limited to this. Even if the ground electrodes are shifted in the horizontal direction, a plasma diffusion preventive effect can be obtained.

Figure 7:
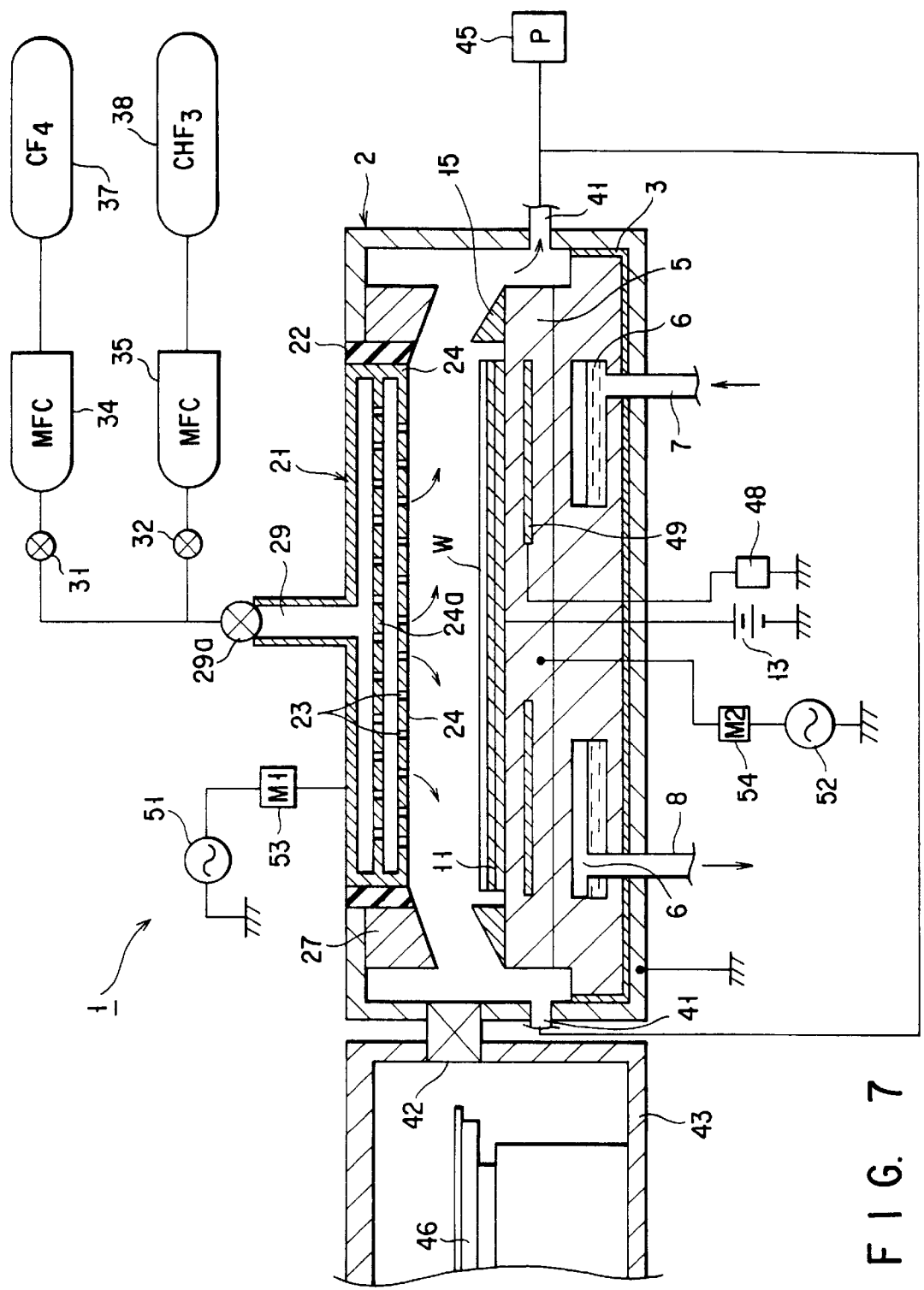
FIG. 7 is a sectional view illustrating an etching apparatus according to another embodiment of the present invention.
Figure 8:
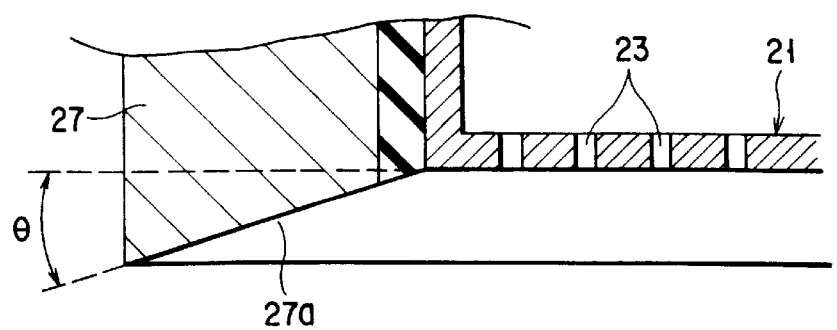
FIG. 8 is an enlarged view showing part of a gas diffusion guide of the apparatus in FIG. 7.

A ground electrode 27 of an apparatus shown in FIG. 7 is formed to be a ring-like shape, and mounted on the upper wall of a chamber 2 to be detachably mounted thereon by a mounting means (not shown) such as a screw. As a result, the ground electrode is electrically grounded through the chamber 2. A cylindrical insulating member 22 is interposed between the inner circumferential surface of the ground electrode 27 and the outer circumferential surface of an upper electrode 21, and both the electrodes are electrically insulated by this insulating member. As shown in FIG. 8, the lower surface of the ground electrode 27 forms a tapered surface 27a extending toward the lower outer direction together with the lower surface of the insulating member 22. In this embodiment, a taper angle $O^2$ is set at 30°, and preferably falls within the range of 25° to 35°.

In this apparatus, the upper surface of a focus ring 15 has a tapered surface so as to be parallel to the tapered surface 27a of the ground electrode 27, as shown in FIG. 7. As a result, a discharge path of a process gas is defined between these tapered surfaces to realize the smooth flow of the process gas toward a plurality (e.g., two in this case) of discharge pipes 41 formed at the lower portions of the side wall of the chamber 2 at equal intervals.

In the embodiment shown in FIG. 7, reference numeral 49 denotes a heating means provided in a susceptor 5 and constituted by a ceramic heater. The susceptor 5 can be heated to a predetermined temperature using this heating means upon power supply from a power supply 48 set outside the chamber 2. Reference numeral 24a denotes a diffusion plate provided to a gas diffusion chamber in the upper electrode 21. The diffusion plate 24a extends parallel to a bottom plate or electrode plate 24. A large number of diffusion holes similar to diffusion holes 23 formed in the electrode plate are formed in the diffusion plate 24a at positions laterally shifted from the diffusion holes 23.

The total width of the gas diffusion guide 27 and the insulating member 22 is preferably set to 15 to 20 mm. The electrode plate 24 of the upper electrode 21 is set such that its center coincides with that of a wafer W, and the electrode plate has a diameter larger than that of the wafer W by about 10%. The tapered surface of the ground electrode 27 is not limited to a flat surface as in this embodiment, and it can be curved upward or downward.

This embodiment will exemplify a case wherein an oxide film (SiO$_2$) formed on the surface of a 6" silicon wafer W is actually etched using the apparatus shown in FIG. 7.

At this time, the pressure in the chamber 2 is set at 10 mTorr, and a flow rate ratio between a CF$_4$ gas and a CHF$_3$ gas as a process gas is set to 25/75 sccm. The temperatures of the lower, upper, and side portions of the chamber are set at about 20° C., 30° C., and 40° C., respectively. A 27-MHz RF power of 2,000 W, and a 800-kHz power of 800 W are supplied to the upper electrode 21 and the susceptor 5, respectively.

Figure 9:
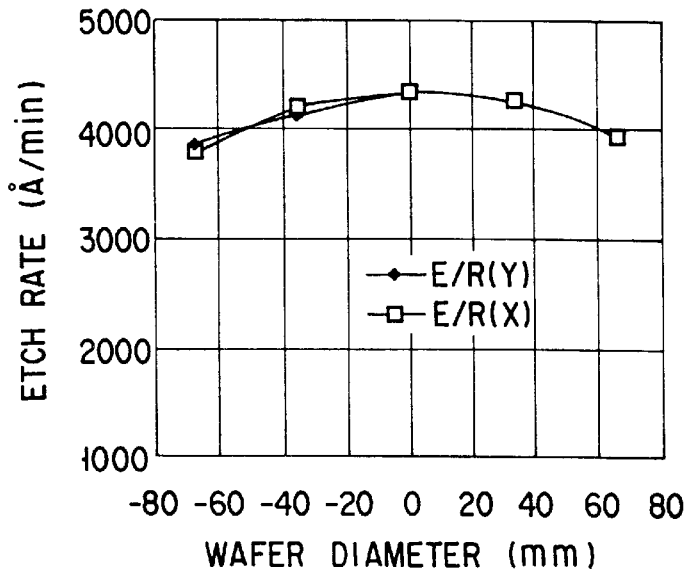
FIG. 9 is a graph showing a relationship between a position radially shifted on a silicon wafer and an etch rate obtained when an oxide film on the silicon wafer is etched in the apparatus of FIG. 7.

The results obtained by etching a wafer under these conditions are represented in FIG. 9. In FIG. 9, a distance (wafer diameter) from the center of a wafer to the peripheral portion is plotted along the ordinate, and an etch rate is plotted along the abscissa. From these results, the highest etch rate is obtained at the center of the wafer, and the etch rate becomes lower toward the peripheral portion thereof. However, even at a position spaced apart from the center by 50 mm, the etch rates are higher than 4,000 Å/min both in an X direction, and a Y direction perpendicular to the X direction. The average of etch rates at measurement points is as high as 4,072 Å/min.

If uniformity (U) of the etch rate is represented by the following equation:

$$U(\%)=(ERmax-ERmin)/2 \cdot ERave \times 100$$

the U is 6.3%. In this equation, the ERmax is the maximum etch rate on the wafer W, the ERmin is the minimum etch rate on the wafer, and ERave is the average etch rate.

In this manner, the reason why a higher etch rate is obtained and the entire wafer surface is uniformly etched is as follows. By using the tapered surface inclined toward the lower outer direction as the lower surface of the ground electrode 27, the process gas is guided toward the wafer W at a uniform distribution, and the flow of the discharged gas toward the discharge pipes 41 becomes smooth, thereby decreasing the conductance of the gas circulation.

Figure 10:
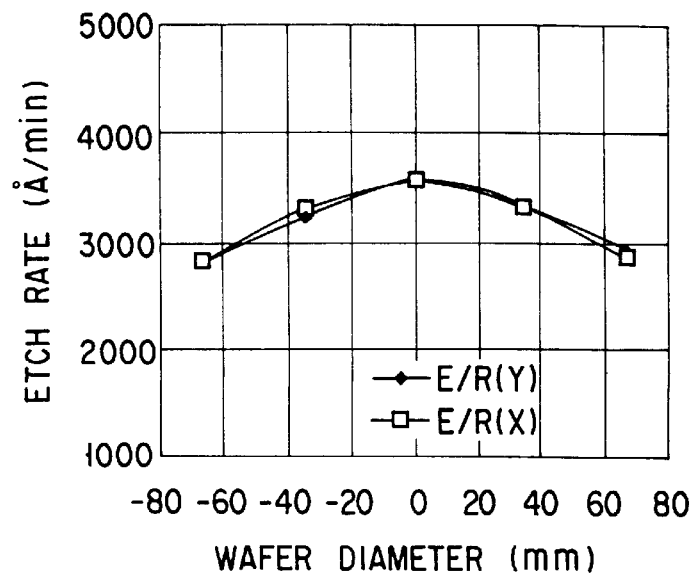
FIG. 10 is a graph for comparing, with the relationship in FIG. 9, a relationship between a position radially shifted on a silicon wafer and an etch rate obtained when an oxide film on the silicon wafer is etched in the apparatus of FIG. 10 wherein the gas diffusion guide is removed.

In order to be compared with this effect, the results obtained when an etching process is performed under the same conditions as described above except for removing a gas guide member (ground electrode) having a tapered surface are represented in FIG. 10. From the results in FIG. 10 and those in FIG. 9, the etch rate is increased in the apparatus of this embodiment, and it becomes higher by about 1,000 Å/min over the entire wafer W. From the comparison between these measurement results, a curve shown in FIG. 9 is more moderate than that shown in FIG. 10. Therefore, the uniformity of the etch rate is higher on the entire wafer surface. Actually, the uniformity (U) calculated from the measurement results in FIG. 10 is 12.3%, and it is lower than the uniformity of 6.3% obtained in the apparatus of this embodiment. The apparatus of this embodiment is excellent in shift between the uniformities in the X and Y directions.

An apparatus shown in FIG. 11 is provided with a ring-like gas diffusion discharge guide 47 at the peripheral portion of the upper surface of the susceptor 5 in place of the focus ring. This guide can consist of an insulating member or a conductive member. When it consists of a conductive member, it may be grounded or need not be grounded. The upper surface of the guide is a tapered surface inclined toward the lower outer direction. The same effect can be obtained in this apparatus as that in the apparatus shown in FIG. 7.

According to the embodiments shown in FIGS. 7 to 11, the gas guide means provided with the tapered surface inclined toward discharge of the gas (the direction of the discharge pipes) on the lower surface of the ground electrode is not necessarily used also as the ground electrode. For example, the ground electrode consists of an insulating member in place of a conductive member, and is used as a gas guide means.

As a means for preventing plasma diffusion, the above embodiments described above exemplify an arrangement wherein at least one electrode is provided in addition to the upper electrode 21 and the susceptor 5. In place of this, as shown in FIG. 12, a large number of opposing magnets may be arranged around the vicinities of the upper electrode 21 and the susceptor 5. That is, an annular insulating member 71 is provided around the lower end portion of the electrode support member 25, and almost columnar permanent magnets 72 shown in FIG. 13 are provided in the insulating member 71 at equal angular intervals. According to this embodiment, as shown in FIG. 12, the N poles of all the permanent magnets 72 are positioned at the lower surface side, i.e., the susceptor 5 side, and intervals at which the permanent magnets 72 are arranged in an annular form are set such that a central angle θ between the permanent magnets adjacent to each other is 20° to 50°, and preferably 10°.

As shown in FIG. 12, an annular insulating member 73 is also provided around the upper end portion of the susceptor 5. The same number of permanent magnets 74 preferably having the same shape, size, and magnetic force as those of the permanent magnets 72 are arranged in the insulating member 73 at the same intervals so as to oppose the corresponding permanent magnets 72. The magnetic poles of the permanent magnets 74 of the first group arranged at the susceptor 5 side are set to be different from those of the permanent magnets 72 of the second group, i.e., the S poles are positioned at the upper electrode 21 side. Therefore, a relationship between the respective permanent magnets 72 and 74 is as shown in FIG. 15.

When the magnets are arranged in this manner, an annular local magnetic field is formed between the circumferential edge portion of the upper electrode 21 and the circumferential portion of the susceptor 5, and the charged particles, which tend to scatter outside the plasma region between the electrodes, in a space between the upper electrode 21 and the susceptor 5 can be trapped, thereby enclosing a plasma in the plasma generation region.

When a magnetic field strength is too large, the plasma itself may be offset to affect the plasma process itself. For this reason, the magnetic field strength around the wafer W serving as the object to be processed is preferably set to be 10 Gauss or less.

Figure 16:
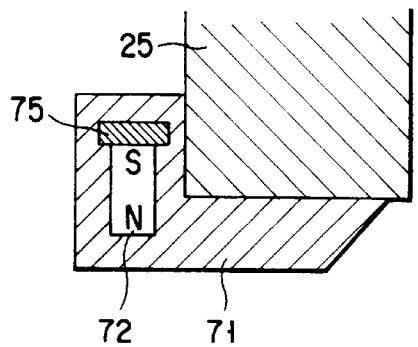
FIG. 16 is a sectional view for explaining an arrangement wherein a magnetic member is mounted on the permanent magnets in FIG. 12.

In order to obtain a more preferable shape of the local magnetic field, as shown in FIG. 16, an annular magnetic member 75 is provided to the upper end portions of the permanent magnets 72 to function as a yoke. In this manner, the magnetic member 75 can be used with the permanent magnet 72.

Figure 17:
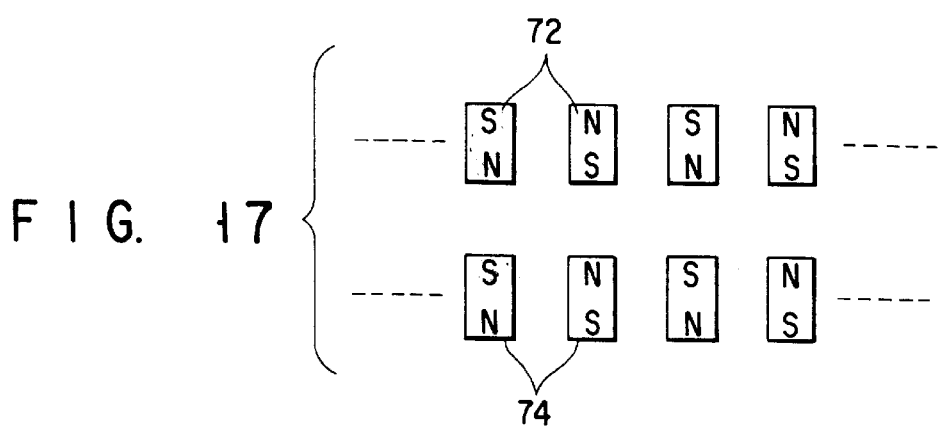
FIG. 17 is a view for explaining another arrangement of the magnetic poles of the permanent magnets.

In the example shown in FIG. 12, the magnetic poles of the permanent magnets 72 arranged at the upper electrode 21 side are different from those of the permanent magnets 74 arranged at the susceptor 5 side, and adjacent magnetics have the same magnetic pole. However, in place of this arrangement, as shown in FIG. 17, when adjacent magnetics have opposing magnetic poles, a further preferable effect can be obtained. That is, with an arrangement shown in FIG. 17, not only the annular magnetic field is formed between the upper and lower opposing portions, but also fluxes are generated between adjacent opposing portions, thereby tightly trapping the discharged particles. Therefore, the plasma enclosing operation is further improved in comparison with the case shown in FIG. 15.

As has been described above, finer micropatterning has been required today with high integration of a semiconductor device in the manufacturing process of semiconductor devices. For example, when a contact hole is to be formed by an etching process, micropatterning is required such that the diameter of a hole is 0.3 $\mu$m, and its depth is 1 to 2 $\mu$m.

Figure 18:
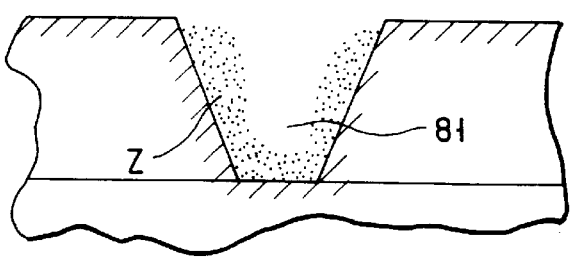
FIG. 18 is a sectional view for explaining a contact hole formed by etching according to a conventional technique.

In the conventional parallel plate type plasma apparatus, however, an RF power supply always supplies a constant output. For this reason, when the diameter of the hole becomes smaller, etching reaction products Z are difficult to be discharged, as shown in FIG. 18, and stack at or near the bottom portion of a hole 81, interrupting smooth exchange with an etching gas. As shown in FIG. 18, the shape of the hole 81 becomes a reverse truncated cone, and an etch rate decreases. Therefore, a problem has been posed that micropatterning corresponding to high integration cannot be performed.

Figure 19:
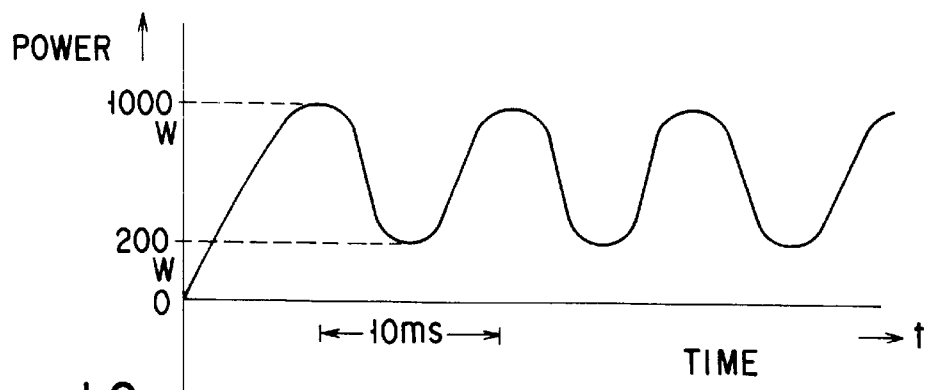
FIG. 19 is a graph showing an output modulation waveform of an RF power to be supplied according to still another embodiment.
Figure 20:
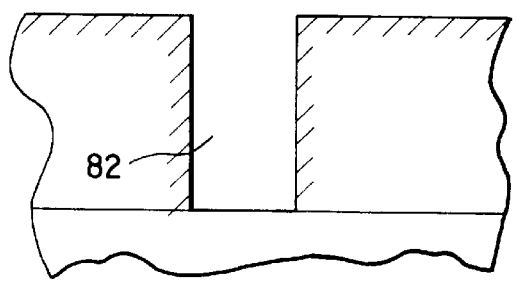
FIG. 20 is a sectional view for explaining a contact hole formed according to the embodiment in FIG. 19.

In order to solve this problem, outputs from the RF power supplies 51 and 52 in the plasma processing apparatus 1 may be controlled to supply powers to the upper electrode 21 and the susceptor 5 so as to alternately repeat a high output and a low output every 10 ms, as shown in a graph of FIG. 19. Referring to FIG. 19, outputs are controlled such that the maximum output is 1,000 W, and the minimum output is ⅕ the maximum output, i.e., 200 W. With this control, a plasma density is increased in a high power to progress etching. In contrast, the plasma density is decreased in a low power to promote discharge of etching reaction products produced in a hole 82 shown in FIG. 20, make exchange with an etching gas smooth, and form a hole whose inlet and bottom portions have the same diameter as shown in FIG. 20.

The maximum and minimum powers and the periods thereof can be properly selected in accordance with the size and material of a target hole, the type of process gas, and the like.

The above plasma processing apparatus 1 is constituted such that RF powers are supplied to the upper electrode 21 and the susceptor 5 using the two RF power supplies for generating a plasma. However, if the etching apparatus 1 is constituted such that any one of the electrodes is always grounded by switching, and only the other electrode is supplied with a power, etching processes in two different modes can be performed by one apparatus arrangement.

Such switching can be performed using one RF power supply. An embodiment shown in FIG. 21 simply exemplifies an etching apparatus 92 which can perform etching processes in such two different modes using one RF power supply 91. FIG. 21 simply illustrates the etching apparatus itself, and the arrangement thereof is the same as that in FIG. 1 or 7. An upper electrode 21 and a lower electrode 5 are provided to oppose each other in a grounded chamber 2 in which a pressure can be freely decreased. A first vacuum relay 96 is housed in a shield box 97 on the chamber 2 to switch a connection between the RF power supply 91 for the upper electrode 21 and the chamber 2.

A second vacuum relay 99 is housed in a matching box 98 to perform switching between the RF power supply 91 for the lower electrode 5 and the grounded side, and switching to turn on/off a path of the etching apparatus 92 connected to the first vacuum relay 96.

The etching apparatus 92 having the above arrangement is in the RIE (reactive ion etching) mode with a high DC bias in a state shown in FIG. 21. In this state, the upper electrode 21 is grounded, and an RF power is supplied from the RF power supply 91 to the lower electrode 5 to perform an etching process, which realizes micropatterning with respect to a wafer present between the electrodes in a high vacuum region and can highly control the vertical shape of the wafer.

When the mode is changed to the PE (plasma etching) mode with a low DC bias shown in FIG. 22 by switching the first vacuum relay 96 to the second vacuum relay 99, the lower electrode 5 is grounded, and an RF power is supplied from the RF power supply 91 to the upper electrode 21 to perform an etching process which rarely damages an object to be processed such as a wafer present between the electrodes, and has high controllability with respect to a size.

Therefore, two different etching processes with respect to the same object to be processed can be sequentially performed only by switching the first vacuum relay 96 and the second vacuum relay 99 in the same chamber, thereby widening the application range of the process.

Figure 23:
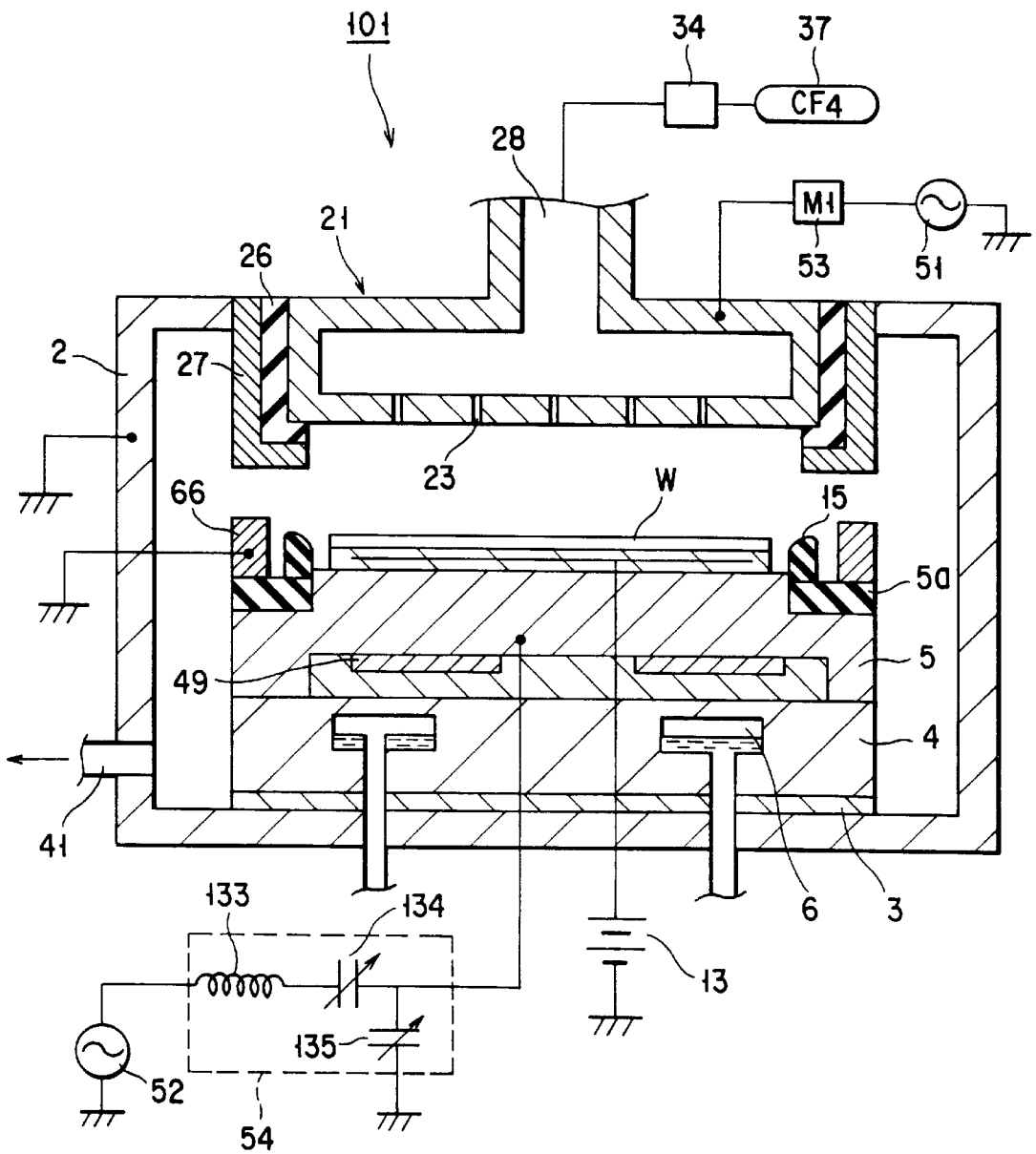
FIG. 23 is a view for explaining an etching apparatus having an arrangement wherein RF powers having different frequencies are supplied to upper and lower opposing electrodes according to still another embodiment.

Still another embodiment will be described. FIG. 23 illustrates a section of an etching apparatus 101 having an arrangement wherein RF powers having different frequencies are supplied to upper and lower opposing electrodes. A process chamber 2 in the etching apparatus 101 is formed to be a cylindrical shape which is air-tightly freely opened/closed and consists of anodized aluminum or the like, and the chamber 2 itself is grounded.

A heating means 49 such as a ceramic heater is provided between a susceptor 5 and a coolant chamber 6. A wafer W is set and kept at a predetermined temperature by heat for cooling from the coolant chamber 6 and the heating means 49.

A ring-like insulating member 5a is embedded in the peripheral edge portion at the upper end of the susceptor 5, an annular focus ring 15 is arranged thereon, and an annular lower ground electrode 66 is provided around the focus ring 15.

An upper electrode 21 parallelly opposing the susceptor 5 and having a gap length of about 25 mm is supported by the upper portion of the chamber 2. An annular upper ground electrode 27 is provided around a cylindrical insulating member 26 mounted on the outer circumferential surface of the upper electrode 21 so as to surround the upper electrode 21. As shown in FIG. 24, the respective outer circumferential edges of the upper ground electrode 27 and the lower ground electrode 66 are grounded so as to vertically overlap each other. That is, both the electrodes 27 and 66 are coaxially provided and have the same outer diameter.

Application of RF powers to the susceptor 5 as a lower electrode and the upper electrode 21 in the etching apparatus 101 will be described below. A power from a relatively low frequency power supply 52 for outputting a relatively low frequency of, e.g., 800 kHz is supplied to the susceptor 5 through a matching unit or matching circuit 54. The matching unit 54 is constituted such that an induction coil 133 is connected in series with a variable capacitor 134, and one terminal of a variable capacitor 135 having the other grounded terminal is connected between the variable capacitor 134 and the susceptor 5. With this arrangement, an impedance of a power from the relatively low frequency power supply 52 is independently controlled by the induction coil 133 and the variable capacitor 134, and its phase is independently controlled by the variable capacitor 135 to perform matching.

On the other hand, an RF frequency from a relatively high frequency power supply 51 for outputting a relatively high frequency power of, e.g., 27 MHz is supplied to the upper electrode 21 through a matching unit 53.

The main part of the etching apparatus 101 according to this embodiment has the above arrangement. An operation or the like obtained when, e.g., an oxide film of a silicon wafer W is to be etched will be described. A $CF_4$ gas is supplied from a process gas source 37 into the chamber 2, and the pressure in the chamber 2 is set and kept at, e.g., 10 mTorr. First of all, a relatively high frequency of 27 MHz is supplied from the relatively high frequency power supply 51 to the upper electrode 21. A relatively low frequency of 800 kHz is supplied from the relatively low frequency power supply 52 to the susceptor 5 with a delay of one second or less, thereby generating a plasma between the upper electrode 21 and the susceptor 5. When the susceptor 5 is driven with the delay to supply a frequency in this manner, the wafer W is prevented from being damaged by an overvoltage.

A silicon oxide film ($SiO_2$) on the surface of the wafer W is etched by radical components of the $CF_4$ gas dissociated by the generated plasma. In this case, the plasma is enclosed by a potential generated from the ground electrode 27 positioned around the upper electrode 21 and the ground electrode 66 positioned around the susceptor 5, and prevented from diffusing, thereby keeping a high density.

According to this embodiment, particularly, as shown in FIG. 24, since the outer circumferential edges of the upper ground electrode 27 and the lower ground electrode 66 vertically overlap each other, a plasma enclosing effect is greatly enhanced. That is, as shown in FIG. 25, when the ground electrode 27 positioned at an outer side with respect to the ground electrode 66, and the outer circumferential edges do not vertically overlap, a plasma is diffused to a certain degree. In contrast, if the outer circumferential edges vertically overlap as in this embodiment, there is no room to diffuse a plasma outward, and a high density can be assured. Therefore, from this viewpoint, a fine etching process can be performed.

Figure 26:
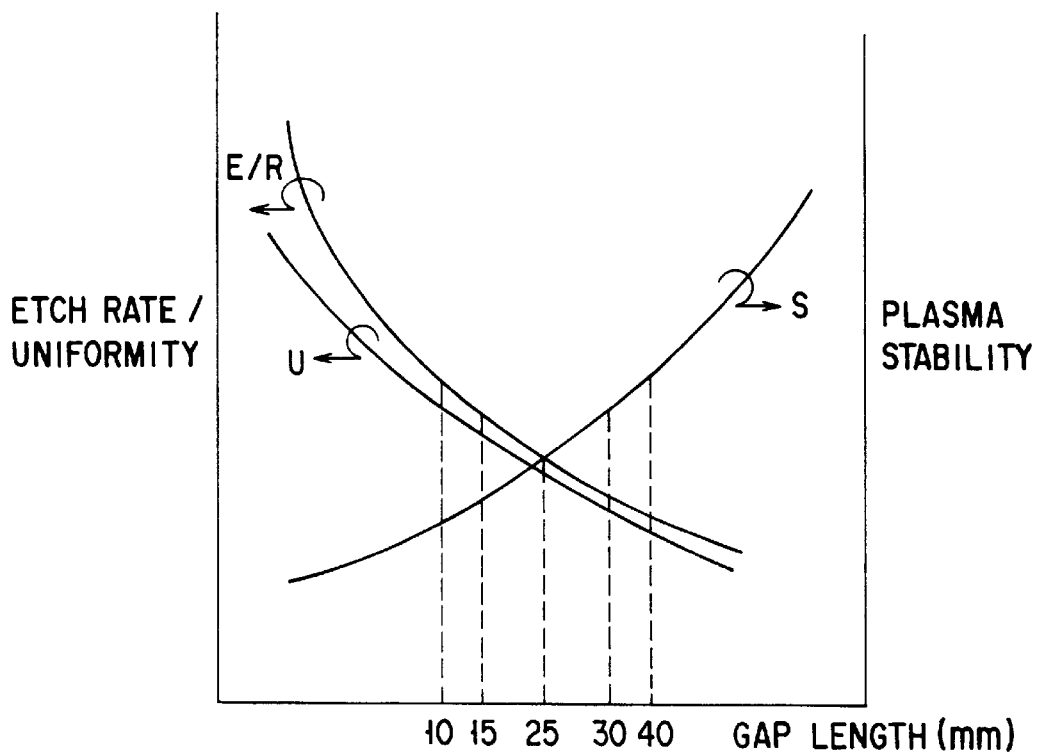
FIG. 26 is a graph showing a relationship between a gap length between the upper and lower opposing electrodes, an etch rate, uniformity, and plasma stability.

The present inventors have confirmed a relationship between a gap length between the upper electrode 21 and the susceptor 5, an etch rate, uniformity of the etch rate (a distribution of the etch rate on a wafer W), and plasma stability (stability in rising, keeping, diffusing a plasma) shown in FIG. 26. That is, as the gap length is larger, a reduction occurs in etch rate (E/R) and uniformity (U), but the plasma stability (S) is improved. In order to realize a fine etching process having a high yield, these three factors must be assured with a good balance. According to the results which the present inventors have obtained, the three factors are balanced at a gap length of about 25 mm, as shown in the graph of FIG. 26.

Since the gap length between the upper electrode 21 and the susceptor 5 is set to 25 mm as described above in this embodiment, a fine etching process having a high yield can be performed with respect to the wafer W. The gap length is not always set to 25 mm because various etching processes are desired. As is apparent from the graph in FIG. 26, if the gap length falls within the range of 15 mm to 35 mm, an etching process can be performed with a good balance, and if the gap length falls within the range of 10 mm to 40 mm, an etching process can be performed with a relatively good balance.

Figure 27:
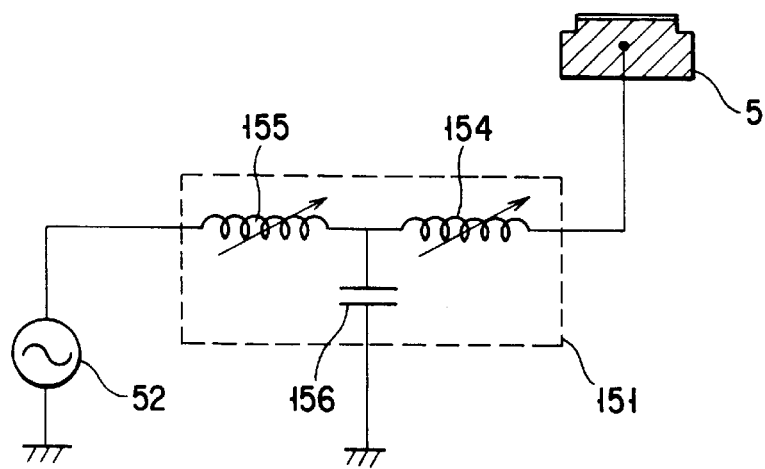
FIG. 27 is a view showing an arrangement of a conventional matching unit.

In the conventional plasma processing apparatus using this type of an RF frequency, in order to match the RF frequencies, a matching unit 151 as shown in FIG. 27 is provided between the RF power supply and an electrode to which an RF power supply is connected, e.g., a lower electrode. The conventional matching unit 151 is constituted such that a variable coil 154 is connected in series with a variable coil 155 between a lower electrode 5 and an RF power supply 52, and one terminal of a capacitor 156 having the other grounded terminal is connected between the variable coils 154 and 155. This arrangement allows matching in a wide range. However, it cannot independently control an impedance and a phase, and an etching process is easily affected by a frequency from, e.g., an upper electrode.

In the etching apparatus 101 according to this embodiment, the induction coil 133 is connected in series with the variable capacitor 134, and one terminal of the variable capacitor 135 having the other grounded terminal is parallelly connected to independently control the impedance and phase of a power from the relatively low frequency power supply 52. For this reason, matching is facilitated, and an etching process is rarely affected by a relatively high frequency from the upper electrode 21. Therefore, a generated plasma is stable, and the prescribed etching process can be also realized from these points.

Figure 28:
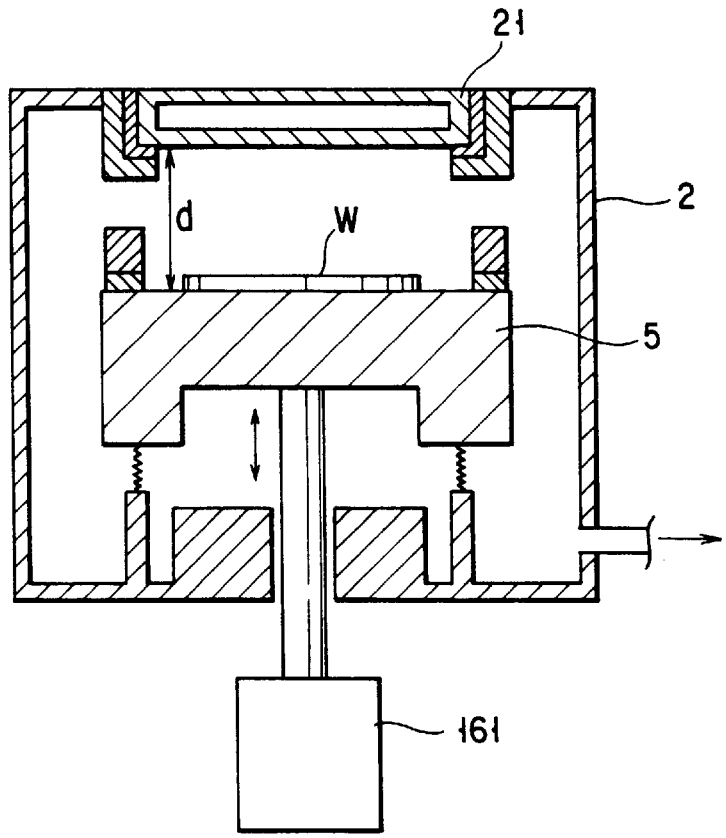
FIG. 28 is a view for explaining still another embodiment wherein a gap length between upper and lower electrodes can be changed.
Figure 30:
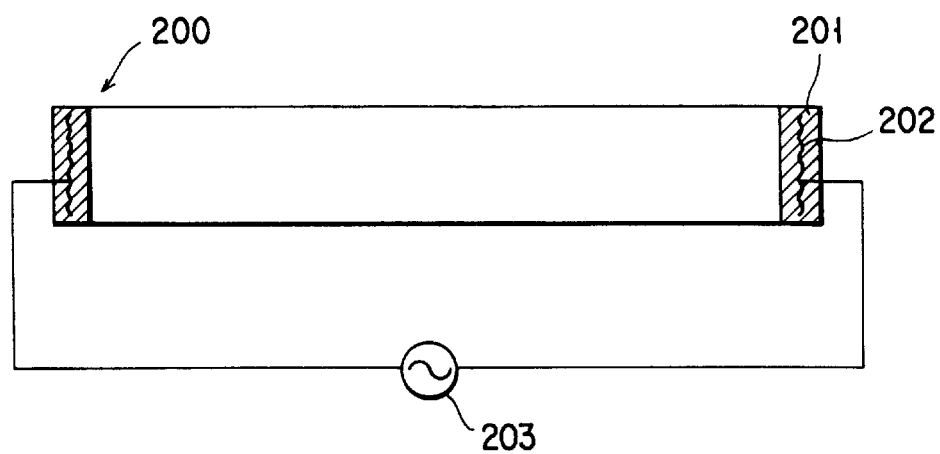
FIG. 30 is a sectional view showing the heating member in FIG. 29.

In the etching apparatus 101 according to this embodiment, both of the upper electrode 21 and the susceptor 5 are fixed, and the gap between the electrodes is fixed to 25 mm. However, in consideration of the characteristics in FIG. 26, the gap length is variable. For example, as shown in FIG. 28, when the susceptor 5 is vertically movable by an adjusting mechanism 161, a gap length d between the upper electrode 21 and the susceptor 5 can be arbitrarily changed.

When a process gas containing C and F, e.g., CF4, $C_2F_5$, $C_3F_8$, $C_4F_8$, or $CHF_3$, is used, at least part of the surface of the upper electrode preferably consists of SiO2. The upper electrode having the above arrangement can be constituted such that the base material thereof is a conductive member such as aluminum, and the surface thereof is covered with an $SiO_2$ film. The $SiO_2$ film preferably has a thickness of 1 to 2 mm, and can be formed by a known method such as CVD or sputtering.

Generally, when the above type of process gas, e.g., a $CHF_3$ gas, is used, underlying silicon as a wafer W is also etched by fluorine radicals (F*) which are extensively produced when dissociation of $CHF_3$ is progressed by a plasma, resulting in a decrease in selectivity. In order to avoid this, a method is known wherein a CO gas is added to the process gas, and a carbon-rich deposition film (a kind of protective film) is formed on the surface of the underlying silicon using this gas, thereby preventing the underlying silicon from being excessively etched by the fluorine radicals.

In the above manner, since at least part of the surface of the upper electrode consists of $SiO_2$, when the process gas containing C and F is introduced and dissociated by a plasma, the following reaction and the like occur:

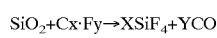

$$SiO_2 + Cx \cdot Fy \rightarrow XSiF_4 + YCO$$

The same effect can be obtained as that of the case wherein a CO gas is added to the process gas in advance.

On the other hand, in place of forming at least part of the surface of the upper electrode with $SiO_2$, part of the surface of a focus ring consists of BN or a material containing BN to obtain the same effect as described above.

This is because excessive fluorine radicals (F*) are combined with B during a process, and the following reaction occurs:

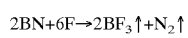

$$2BN + 6F \rightarrow 2BF_3\uparrow + N_2\uparrow$$

$F_3$ is effectively discharged, thereby decreasing the fluorine radicals in a plasma.

In this manner, any one or both of the technique for forming at least part of the surface of the upper electrode with SiO$_2$, and the technique for forming part of the surface of the focus ring with BN or a material containing BN can be used.

Figure 29:
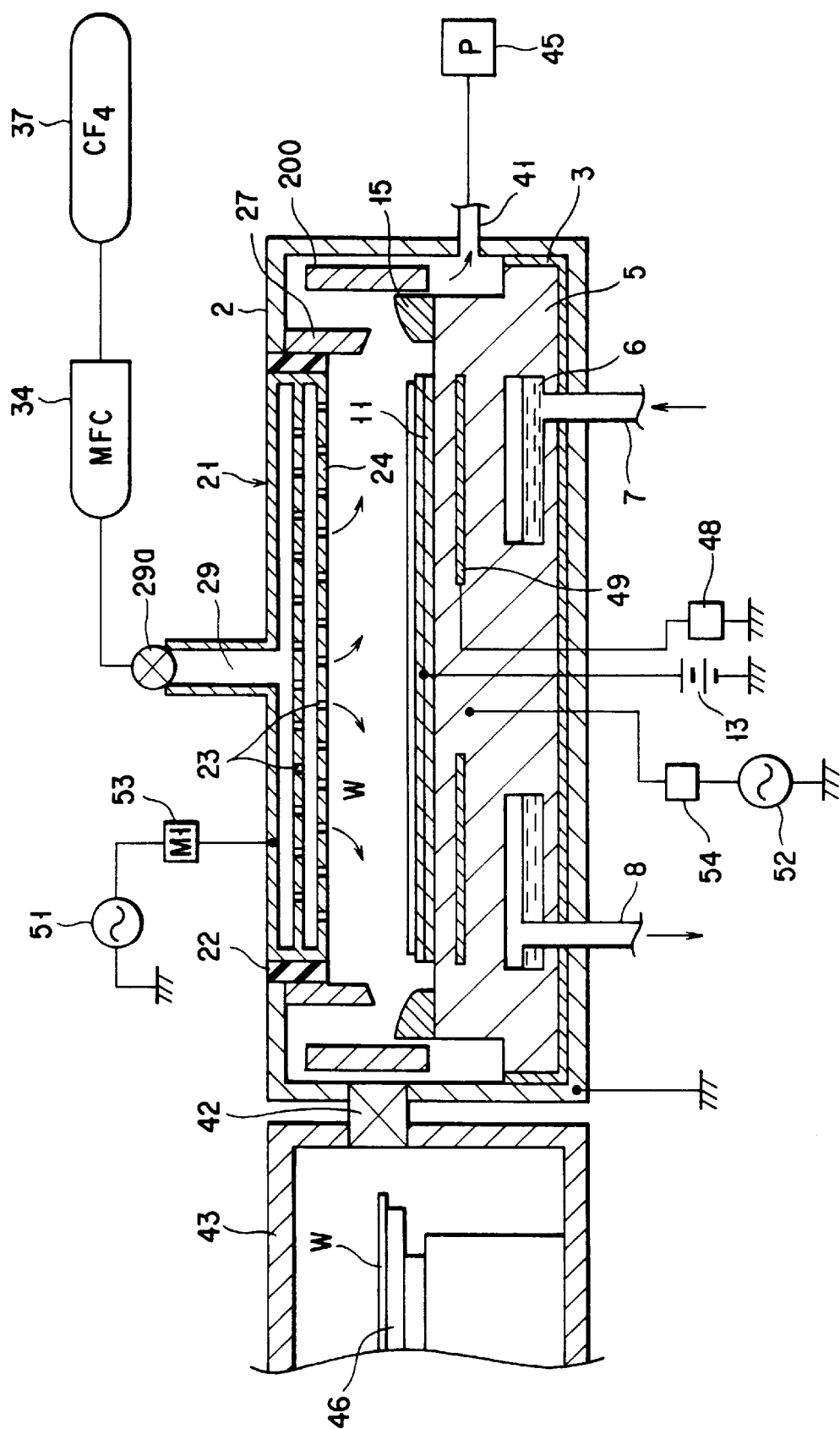
FIG. 29 is a sectional view illustrating an etching apparatus having a heating member according to still another embodiment.

In an apparatus shown in FIG. 29, a cylindrical heating member 200 is provided between the inner surface of a chamber 2 and a plasma generation region (between upper and lower electrodes) near the inner surface of the chamber so as to effectively prevent a deposition film as a cause of contamination from attaching to the inner surface of the chamber 2. The heating member 200 is constituted such that a heater 202 as an electrically heating means such as a heating resistor or ceramic heater is embedded in a cylinder 201 consisting of, e.g., quartz or ceramic. The entire heater 202 is embedded in the cylinder 201 so as not to be exposed outside. With this arrangement, the interior of the chamber 2 can be set in a high vacuum of, e.g., 10 mTorr without posing any problem. The heater 202 is connected to a power supply 203, and the heater is heated to an arbitrary temperature of 40° C. to 200° C. Since the inner surface of the chamber 2 is effectively heated by the heating member 200, a deposition film can be prevented from attaching on this inner surface.

The heating member 200 can be hung from the upper wall of the chamber, or arranged on a susceptor 5. In order not to interrupt conveyance of a wafer W, the heating member or the susceptor is preferably arranged to be vertically movable.

Figure 31:
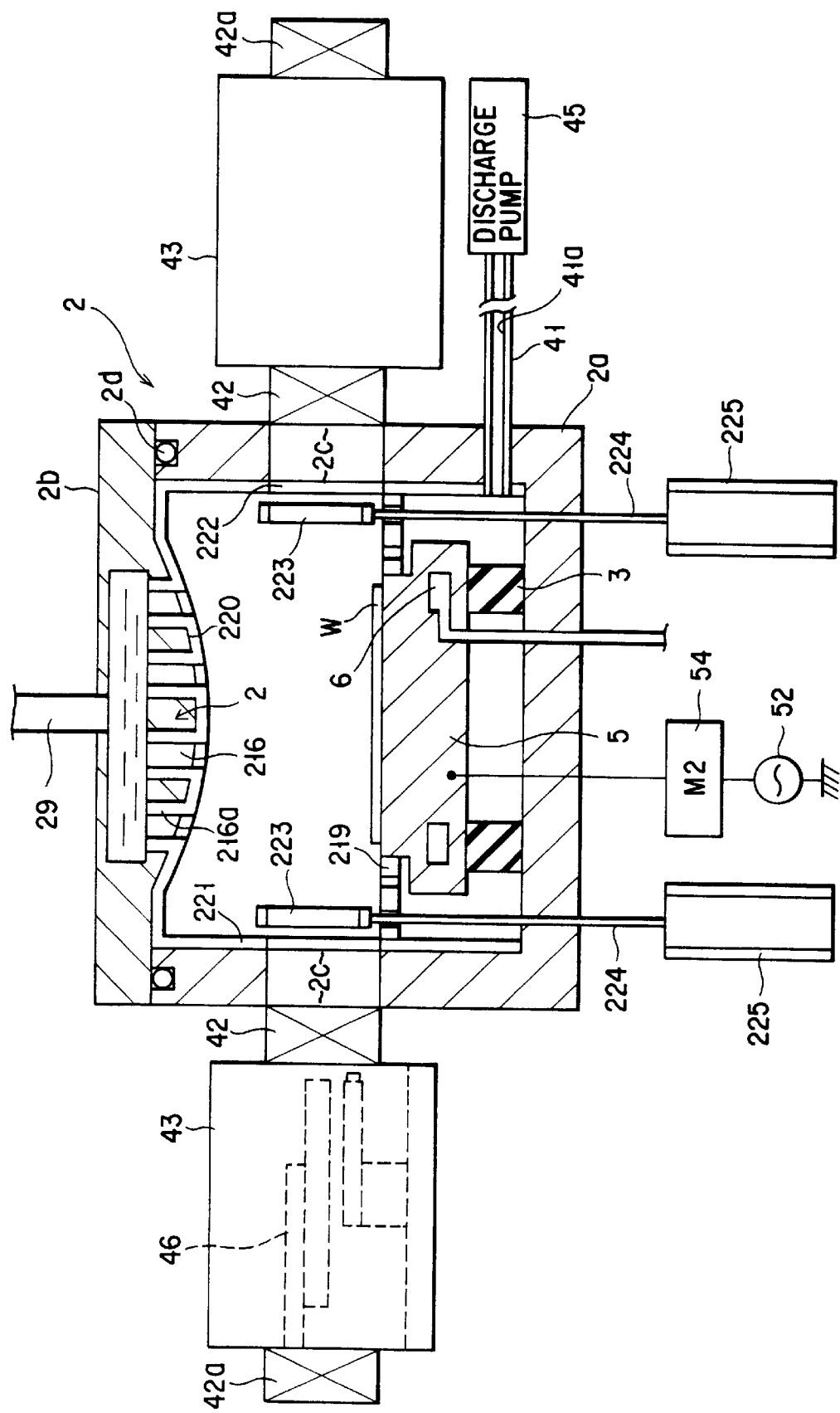
FIG. 31 is a view illustrating an etching apparatus for explaining a carbon application technique applicable to the embodiments of the present invention.

A technical concept of applying carbon to an etching apparatus according to the embodiment of the present invention so as to avoid degradation of an etching chamber and to reliably avoid metal contamination to a semiconductor wafer or the like will be described with reference to FIGS. 31 and 32.

A cylindrical etching chamber 2 is constituted by a cylindrical lower portion 2a of the etching chamber having a bottom and consisting of a material such as aluminum whose surface is anodized, and a disk-like upper portion 2b of the etching chamber which is arranged so as to air-tightly close the opening at the upper portion of the lower portion 2a of the etching chamber, and consists of the same material. An O-ring 2d for air-tightly holding the interior of the chamber is arranged at a contact portion between the upper and lower portions.

Figure 32:
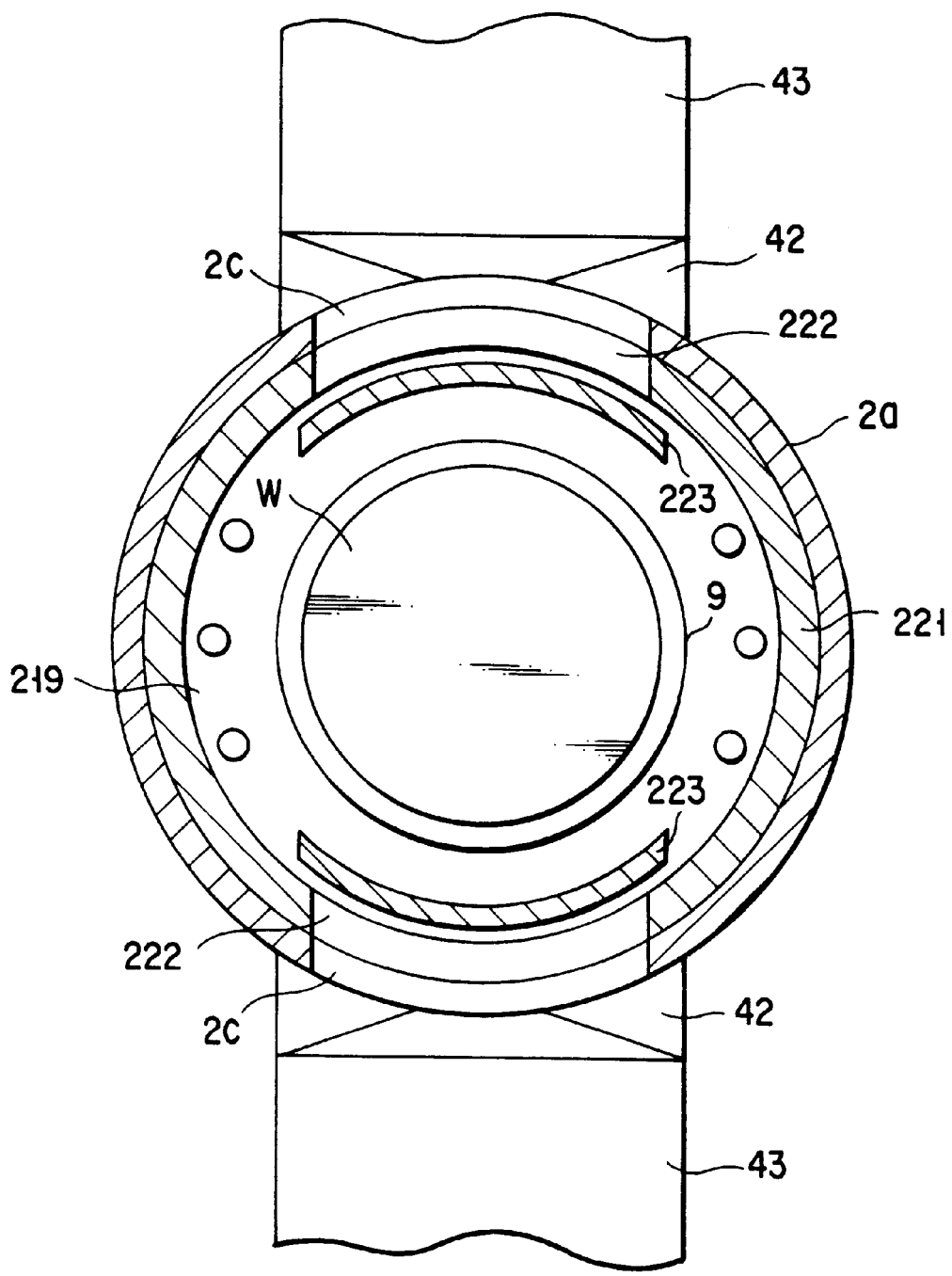
FIG. 32 is a schematic cross-sectional view showing the apparatus in FIG. 31.

As also shown in FIG. 32, openings 2c for loading/unloading a semiconductor wafer W are formed at two sides of the peripheral wall portion of the lower portion 2a of the etching chamber so as to oppose each other. Load-lock chambers 43 are arranged outside the openings 2c through gate valves 42, respectively. Convey mechanisms 46 for loading/unloading the semiconductor wafer W (only one is shown) are arranged in the respective load-lock chambers 43. Usually, one load-lock chamber 43 is only for loading, and the other load-lock chamber 43 is only for unloading. Reference numeral 42a denotes each gate valve for shielding/releasing each load-lock chamber 43 from/to the outside.

A disk-like susceptor, i.e., a lower electrode 5, consisting of a material such as aluminum whose surface is anodized is arranged in the etching chamber 2 so as to be supported by an insulating support plate 3 consisting of a material such as a ceramic. The lower electrode 5 is connected to an RF power supply 52 through a matching circuit 54, and a coolant circulation path 6 for cooling is arranged in the lower electrode 5. The upper surface of the lower electrode 5 is formed to be flat so as to chuck and hold the semiconductor wafer W by, e.g., an electrostatic chuck or the like.

On the other hand, an upper electrode 21 is set at a portion opposing the lower electrode 5 on the upper portion 2b of the etching chamber. A gas supply pipe 29 extending from a gas source (not shown) is connected to the upper electrode 21. A predetermined etching gas supplied from the gas supply pipe 29 is diffused by a gas diffusion plate in which a large number of through holes are formed in gas diffusing gaps 216 formed in the upper electrode 21, and uniformly supplied from a large number of through holes 216 formed in the lower side surface of the upper electrode 21 onto the semiconductor wafer W placed on the lower electrode 5.

A discharge pipe 41 connected to a discharge pump 45 is connected to the lower portion of the etching chamber 2. As shown in FIG. 32, a baffle plate 219 in which a large number of through holes are formed is horizontally arranged around the lower electrode 5 so as to uniformly perform discharge.

The baffle plate 219 consists of carbon. The interior of the discharge pipe 41 is covered with a carbon coating film 41a by a predetermined distance, e.g., about several tens cm to 1 m from the etching chamber 2. The lower side surface of the upper electrode 21 is covered with a carbon plate 220. The interior of each through hole 216 is covered with a carbon coating film 216a. A carbon cylinder 221 is located in the etching chamber 2 so as to cover the inner wall surface.

Opening portions 222 are formed in the carbon cylinder 221 in correspondence to the two openings 2c. Carbon shutter plates 223 are arranged so as to freely open/close the opening portions 222. As shown in FIG. 32, each of the shutter plates 223 is constituted by an arcuated plate member having almost the same curvature as that of the inner wall surface of the etching chamber. The shutter plate 223 is connected, through a shaft 224, to an air cylinder 225 provided outside the etching chamber 2, and is vertically moved by expansion and contraction of the air cylinder 225. For example, a bellows mechanism (not shown) as a mechanism for keeping an air-tight state between these members is provided at a through portion of the shaft 224 of the etching chamber 2.

The above carbon members, i.e., the baffle plate 219, the plate 220, the cylinder 221, and the shutter plates 223 are set to have a thickness of, e.g., 1 to 20 mm.

In the etching apparatus having the above arrangement, the evacuating means or vacuum pump 45 is operated in advance to set the interior of the etching chamber 2 at a predetermined vacuum degree.

The gate valve 42 of one of the load-lock chambers 43 is opened, and the semiconductor wafer W is loaded into the load-lock chamber 43 by the convey mechanism 46. Then, the gate valve 42 is closed to set the interior of the load-lock chamber 43 at a predetermined vacuum degree. Thereafter, the gate valve 42 is opened, the shutter plate 223 is moved from the front of the is opening 2c, and the semiconductor wafer W is placed on the lower electrode 5 by the convey mechanism 46.

The convey mechanism 46 is retreated from the etching chamber 2, and the gate valve 42 is closed. At the same time, the shutter plate 223 is moved to the front of the opening 2c, and a predetermined etching gas, e.g., $Cl_2+BCl_3$, is supplied from the gas supply pipe 29 in this state. In addition to this operation, an RF power of, e.g., 13.56 MHz is supplied from the RF power supply 52 to form the etching gas into a plasma, thereby etching the semiconductor wafer W by the so-called reactive ion etching.

At this time, in the etching apparatus of this embodiment, portions exposed to the plasma in the etching chamber 2 consist of carbon except for the surface of the semiconductor wafer W. For this reason, for example, corrosion to the gate valves 42 of the openings 2c and the through holes 216 in the upper electrode 21, and contamination to the semiconductor wafer W by aluminum and the like can be avoided. The carbon plate 220, the carbon cylinder 221, the carbon shutter plates 223, and the like are etched to be consumed. These members which can be manufactured at relatively low costs are exchanged with new members. The lower portion 2a and the upper portion 2b of the etching chamber and the like can be prevented from being degraded.

When aluminum is to be etched, the selectivity of the semiconductor wafer W can be increased by an action of carbon etched from the plate 220, the cylinder 221, the shutter plates 223, and the like. That is, a side wall protective film consisting of a carbon polymer tends to be formed on the side wall portion of the wafer as a non-etched portion on which a photoresist is formed as a mask, and so-called under-cut to the side wall portion is suppressed, thereby increasing the selectivity.

Since the shutter plates 223 is constituted by an arcuated plate member having almost the same curvature as that of the inner wall surface of the etching chamber, a plasma generated in the etching chamber has a uniform, equal density along the inner wall surface of the etching chamber. Therefore, the semiconductor wafer W is uniformly processed, and the yield is increased.

Each embodiment has exemplified a case wherein a semiconductor wafer is used as an object to be processed. However, the present invention is not limited to this. For example, the present invention can have an apparatus arrangement wherein an LCD substrate or the like is to be processed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus comprising:

a chamber;

a supporter having a first electrode provided in said chamber and supporting an object to be processed;

a second electrode provided opposite to said first electrode and having the object supported by said supporter interposed, said first electrode and said second electrode defining a plasma generating region therebetween;

means for supplying a process gas to the plasma generating region;

RF power supply for supplying an RF power voltage to at least one of said first electrode and said second electrode and generating a plasma of the process gas in the plasma generating region, thereby performing a plasma process with respect to the object;

a first magnet assembly arranged circumferential to said first electrode; and a second magnet assembly arranged opposite to said first magnet assembly at a predetermined distance from said first magnet assembly, and circumferential to said second electrode, said first magnet assembly and said second magnet assembly generating a magnetic field perpendicular to a surface of the object to be processed and generating a magnetic field such that the magnetic field encircles the plasma generating region, thereby enclosing the plasma in the plasma generating region, wherein said first magnet assembly and said second magnet assembly have a plurality of permanent magnets arranged in an annular form, permanent magnets of said first magnet assembly and permanent magnets of said second magnet assembly are the same in number and dimensions and correspond to each other in position, and surfaces of corresponding permanent magnets facing each other have different magnetic poles, and wherein the first and second magnet assemblies are disposed within the chamber.

2. The apparatus according to claim 1, wherein surfaces of adjacent permanent magnets of said first magnet assembly facing surfaces of the permanent magnets of said second magnet assembly have identical magnetic poles.

3. The apparatus according to claim 1, wherein surfaces of adjacent permanent magnets of said first magnet assembly facing surfaces of the permanent magnets of said second magnet assembly have different magnetic poles.

* * * * *